(12) United States Patent
Tojo et al.

(10) Patent No.: US 8,193,643 B2
(45) Date of Patent: Jun. 5, 2012

(54) SEMICONDUCTOR DEVICE AND METHOD FOR FABRICATING THE SAME

(75) Inventors: Akira Tojo, Kanagawa-ken (JP);
Tomoyuki Kitani, Kanagawa-ken (JP);
Tomohiro Iguchi, Kanagawa-ken (JP);
Takahiro Aizawa, Kanagawa-ken (JP);
Hideo Nishiuchi, Kanagawa-ken (JP);
Masako Fukumitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 12/546,916

(22) Filed: Aug. 25, 2009

(65) Prior Publication Data
US 2010/0052185 A1    Mar. 4, 2010

(30) Foreign Application Priority Data
Sep. 3, 2008    (JP) .................................. 2008-226236

(51) Int. Cl.
*H01L 23/28* (2006.01)

(52) U.S. Cl. .......... 257/774; 257/E23.011; 257/E23.166
(58) Field of Classification Search .................. 257/774, 257/E23.011, E23.116
See application file for complete search history.

(56) References Cited

U.S. PATENT DOCUMENTS

| 5,572,068 | A  | * | 11/1996 | Chun ............................. 257/686 |
| 2008/0013249 | A1 | * | 1/2008 | Ewe et al. ....................... 361/305 |
| 2009/0250709 | A1 | * | 10/2009 | Chang et al. ..................... 257/88 |

FOREIGN PATENT DOCUMENTS

JP    2004-165314    6/2004

* cited by examiner

*Primary Examiner* — Alexander Ghyka
*Assistant Examiner* — Stanetta Isaac
(74) *Attorney, Agent, or Firm* — Oblon, Spivak, McClelland, Maier & Neustadt, L.L.P.

(57) ABSTRACT

According to an aspect of the present invention, there is provided a semiconductor device, including a semiconductor chip including a semiconductor element, a first electrode of the semiconductor chip being configured on a first surface of the semiconductor element, a second electrode of the semiconductor element being configured on a second surface opposed to the first surface of the semiconductor chip, an encapsulating material encapsulating the semiconductor chip, a first hole and a second hole being configured in the encapsulating material, a portion of the first electrode and a portion of the second electrode being exposed, a first conductive material being connected to the first surface of the semiconductor chip via the first hole, a second conductive material being connected to the second surface of the semiconductor chip via the second hole, and a plating film covering five surfaces of the first conductive material other than one surface contacting with the encapsulating material and five surfaces of the second conductive material other than one surface contacting with the encapsulating material.

8 Claims, 25 Drawing Sheets

SEMICONDUCTOR DEVICE AND METHOD FOR FABRICATING THE SAME

CROSS REFERENCE TO RELATED APPLICATION

This application is based upon and claims the benefit of priority from the prior Japanese Patent Application No. JP2008-226236, filed Sep. 3, 2008; the entire contents of which are incorporated herein by reference.

FIELD OF THE INVENTION

The present invention relates to a semiconductor device and a method for fabricating the semiconductor device, and more particularly, relates to a semiconductor device including a semiconductor chip and a method for fabricating the semiconductor device.

DESCRIPTION OF THE BACKGROUND

A bonding wire electrically connects between a semiconductor chip and an outer electrode in a conventional semiconductor device as a surface-mount device disclosed in Japanese Patent Publication (Kokai) No. 2006-278520. The semiconductor device using wire-bonding is simply shown in FIG. 39, for example, and is explained below.

A semiconductor device 1000 includes a semiconductor chip 1001 having a surface electrode 1001a and a back surface electrode 1001b on the front surface and the back surface, respectively. An outer electrode 1002 is connected to the back surface electrode 1001b of the semiconductor chip 1001 via a conductive material (not shown) and the surface electrode 1001a of the semiconductor chip 1001 is connected to an outer electrode 1003 by a bonding wire 1004. The semiconductor device 1000 is encapsulated to be airproofed by an encapsulation resin 1005. In the semiconductor device 1000, wiring pads 1007 configured on a substrate 1006 are mutually connected via the outer electrodes 1002 and 1003 and a conductive material (not shown).

Further, as a feature of other small-type electronic device, for example, a type as shown in FIG. 40 can be listed. A semiconductor device 1010 is constituted with a stacked capacitor 1011 and a pair of outer electrode 1012 connected to the both ends of the stacked capacitor 1011, respectively. A semiconductor chip (not shown) is disposed in the stacked capacitor 1011. Five surfaces of the outer electrode 1012 other than the surface connected to the stacked capacitor 1011 act as an electrode. Furthermore, the outer electrode 1012 is disposed on wiring pads 1014 configured on a substrate 1013. As shown in FIG. 40, a solder 1015 is disposed on the wiring pads 1014 and the outer electrode 1012. The substrate 1013 and the semiconductor device 1010 are electrically connected by the solder 1015.

However, the semiconductor device using the bonding wire disclosed in Japanese Patent Publication (Kokai) No. 2006-278520 has problems mentioned below.

Improvement of electrical characteristics of electron devices, for example, has been desired according to popularization of a cell phone or electronics. An electrical resistance of a bonding wire is increased in the semiconductor device by using the bonding wire. Therefore, improvement in electric characteristics is difficult. Furthermore, as shown in FIG. 39, the surface electrode 1001a of the semiconductor chip 1001 is individually connected to the outer electrode 1003. Consequently, decrease of steps in a fabrication process and shortage of takt time cannot be performed so that productivity cannot be improved.

As shown in FIG. 40, the semiconductor device has a structure that the semiconductor chip is encapsulated in the stacked capacitor. The structure can be improved in electric characteristics due to non-bonding wire as compared to the semiconductor device 1000 having the bonding wire. On the other hand, a problem may occur when the semiconductor chip is encapsulated. The problem is that the semiconductor element in the semiconductor device is failed. The stacked capacitor 1011 is laminated with hard insulators sandwiching as shown in FIG. 40 and is fabricated by thermocompression. When encapsulating the semiconductor chip, a load to the semiconductor chip in thermocompression may provide damages to the semiconductor chip, which leads to degradation of yield in the fabrication process.

Furthermore, peeling between the semiconductor chip and the material sandwiching the semiconductor chip at a contacting interface may be generated in reliability test or a shock accompanying with falling, which may lead to degradation of yield in the fabrication process.

Moreover, display of polarity is necessary for the semiconductor device as shown in both FIG. 39 and FIG. 40. On the other hand, the display of polarity on each semiconductor device generates an obstacle in improvement of productivity.

A method for fabricating the semiconductor device includes disposing the semiconductor chip or the individuated semiconductor element on an electrode or a resin substrate using a mounting tool in the processing steps. The processing steps flows accompanying with absorbing the semiconductor chip or the semiconductor element, picking up, transferring, disposing, absorbing off and absorbing next semiconductor chip or semiconductor element or the like to consume long time. In the processing steps, accuracy of the disposing position on the semiconductor chip or the semiconductor element depends on accuracy of the mounting tool. Accordingly, accuracy improvement of the disposing position has a limitation in the processing steps.

SUMMARY OF THE INVENTION

According to an aspect of the invention, there is provided a semiconductor device, including, a semiconductor chip including a semiconductor element, a first electrode of the semiconductor chip being configured on a first surface of the semiconductor element, a second electrode of the semiconductor element being configured on a second surface opposed to the first surface of the semiconductor chip, an encapsulating material encapsulating the semiconductor chip, a first hole and a second hole being configured in the encapsulating material, a portion of the first electrode and a portion of the second electrode being exposed, a first conductive material being connected to the first surface of the semiconductor chip via the first hole, a second conductive material being connected to the second surface of the semiconductor chip via the second hole, and a plating film covering five surfaces of the first conductive material other than one surface contacting with the encapsulating material and five surfaces of the second conductive material other than one surface contacting with the encapsulating material.

Further, another aspect of the invention, there is provided a method for fabricating a semiconductor device, including, sticking a first encapsulating material on one surface of a semiconductor substrate, cutting the semiconductor substrate from the other surface of the semiconductor substrate to the one surface of the semiconductor substrate being an adhesion surface with the first encapsulating material to divide the semiconductor substrate into a plurality of semiconductor chips, hardening a second encapsulating material disposed on the other surface of the semiconductor substrate by thermocompression, forming a first hole and a second hole in the first encapsulating material and the second encapsulating material, respectively, to expose a first electrode and a second electrode configured on a first surface and a second surface of each semiconductor chip, forming a first conductive material and a second conductive material on the first encapsulating material and the second encapsulating material, respectively, and filling the first conductive material and the second conductive material into the first hole and the second hole, respectively, by plating, cutting a space between the semiconductor chips to individuate into the plurality of the semiconductor chips, and forming a first plating film on the first conductive material and the second conductive material.

Further, another aspect of the invention, there is provided, a method for fabricating a semiconductor device, including cutting a semiconductor substrate stuck on a first body to individuate into semiconductor chips, cutting only an adhesive film having an adhesive layer configured on a second body to frame a semiconductor chip disposing-portion disposing the semiconductor chip and a street portion between the adjacent semiconductor chip disposing-portions, removing the adhesive layer on the street portion, sticking the adhesive layer on a first encapsulating material, removing the second body from the adhesive film stuck on the first body, sticking the semiconductor chip on the semiconductor chip disposing-portion of the adhesive film stuck on the first encapsulating material, removing the first body from the semiconductor substrate, hardening a second encapsulating material disposed on the semiconductor chip by thermocompression, forming a first hole in the first encapsulating material and a second hole in the second encapsulating material to expose a first electrode of a first surface and a second electrode on a second surface in the semiconductor chip, forming a first conductive material and a second conductive material on the first encapsulating material and the second encapsulating material, respectively, and filling the first conductive material and the second conductive material into the first hole and the second hole, respectively, by plating, cutting a space between the semiconductor chips to individuate into the plurality of the semiconductor chips, and forming a first plating film on the first conductive material and the second conductive material.

Further, another aspect of the invention, there is provided, a method for fabricating a semiconductor device, comprising, cutting a semiconductor substrate stuck on an adhesive film having an adhesive layer on a body, forming a mask on a surface opposed to the adhesive layer, the mask having an opening at a region of the semiconductor chip, the body being sandwiched between the mask and the adhesive layer, the opening being interposed the semiconductor chip via the body, irradiating light from the mask side to the body, sticking an adhesive sheet to a surface opposed to the adhesive film, the semiconductor substrate being sandwiched between the adhesive sheet and the adhesive film, peeling off the adhesive sheet, an adhesion portion of the semiconductor substrate and a portion of the semiconductor substrate stuck on the adhesive film to separate the semiconductor chip and the street portion between the adjacent semiconductor chips, sticking the semiconductor chip bonded with the adhesive sheet on a first encapsulating material, peeling off the adhesive sheet from the semiconductor chip, hardening a second encapsulating material disposed on the semiconductor chip by thermocompression, forming a first hole in the first encapsulating material and a second hole in the second encapsulating material to expose a first electrode of a first surface and a second electrode on a second surface in the semiconductor chip, forming a first conductive material and a second conductive material on the first encapsulating material and the second encapsulating material, respectively, and filling the first conductive material and the second conductive material into the first hole and the second hole, respectively, by plating, cutting a space between the semiconductor chips to individuate into the plurality of the semiconductor chips, and forming a first plating film on the first conductive material and the second conductive material.

DETAILED DESCRIPTION OF THE INVENTION

Figure 1:
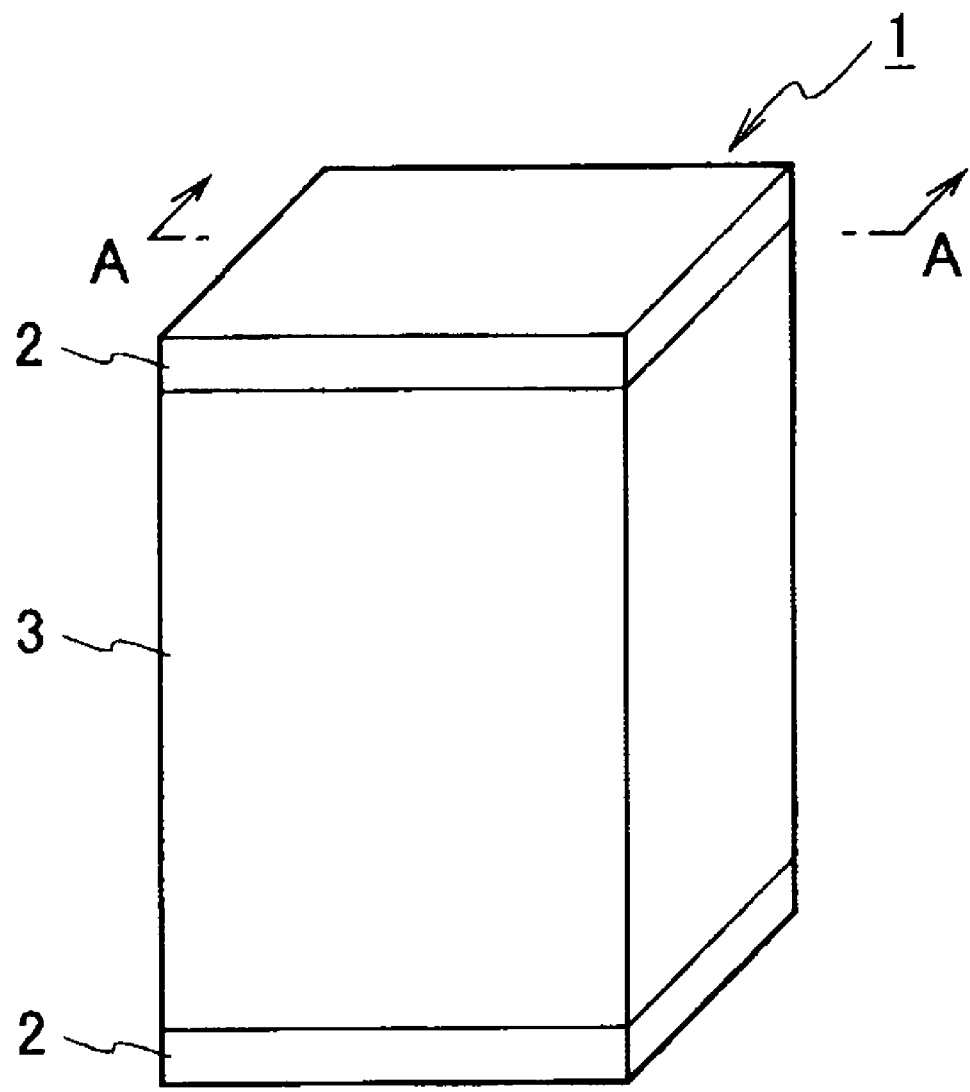
FIG. 1 is an overall view showing a semiconductor device according to a first embodiment of the present invention.

Embodiments of the present invention will be described below in detail with reference to the drawing mentioned above. It should be noted that the present invention is not restricted to the embodiments but covers their equivalents. Throughout the attached drawings, similar or same reference numerals show similar, equivalent or same components.

First Embodiment

First, a semiconductor device according to a first embodiment of the present invention will be described below in detail with reference to FIGS. 1-8. FIG. 1 is an overall view showing the semiconductor device according to the first embodiment of the present invention. As shown in FIG. 1, the semiconductor device has nearly a rectangular parallelepiped shape.

Figure 40:
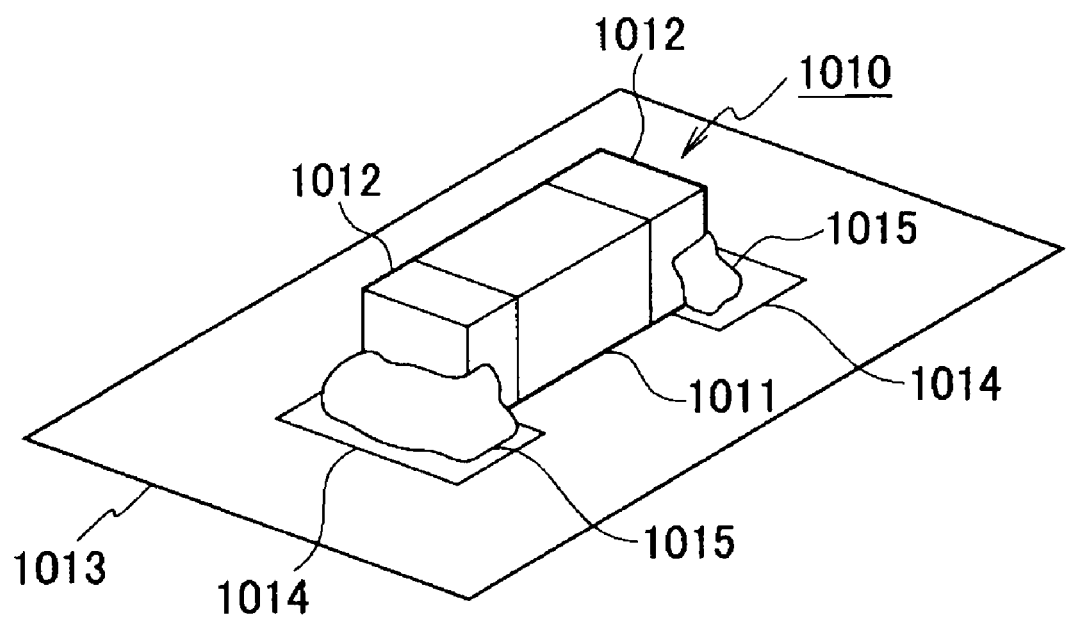
FIG. 40 is a cross-sectional diagram showing a conventional semiconductor device.

A pair of conductive materials 2 is configured in the semiconductor device 1 and plays a role as an outer electrode. A portion encapsulated by an encapsulating material 3 is configured in the semiconductor device 1 to be sandwiched between the pair of the conductive materials 2. The encapsulating material 3 encapsulates a semiconductor chip 5 (not illustrated in FIG. 1) configured in the semiconductor device 1. Each of the conductive materials 2 is plated to be covered with plating film 4 (not illustrated in FIG. 1). Accordingly, an electrode with five surfaces as an outer electrode is formed on five surfaces of the conductive material 2 other than a surface contacting with the encapsulating material 3. A color of the encapsulating material 3 can be arbitrary changed. When the semiconductor chip 5 is encapsulated, polarity of the semiconductor device 1 can be represented by using the encapsulating material 3 with different colors. The semiconductor device 1 is used as an aspect as shown in FIG. 40.

Figure 2:
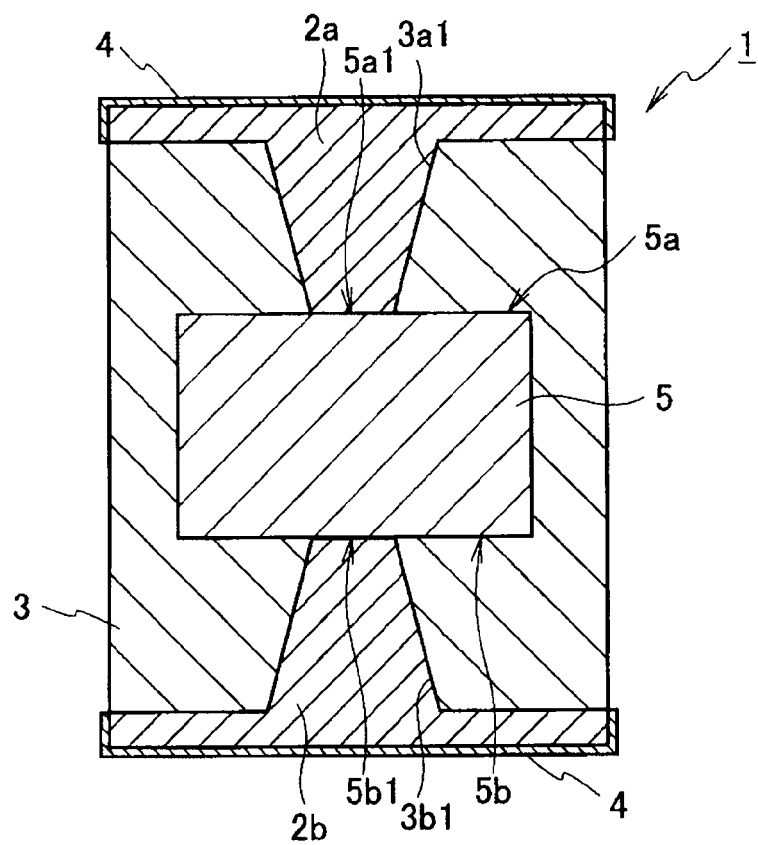
FIG. 2 is a cross-sectional view along line A-A in FIG. 1 showing the semiconductor device according to the first embodiment of the present invention.

FIG. 2 is a cross-sectional view along line A-A in FIG. 1. The semiconductor chip 5 has nearly the rectangular parallelepiped shape. The lateral direction of the semiconductor chip 5 is configured to be parallel in the longitudinal direction of the semiconductor device 1. A first electrode 5a1 of a semiconductor element is disposed on a first surface 5a of the semiconductor chip 5 and a second electrode 5b1 of the semiconductor element is disposed on a second surface 5b opposed to the first surface 5a. Here, as a matter of convenience for explanation, the first surface 5a and the second surface 5b are specified to be represented as the first electrode 5a1 and the second electrode 5b1 for the electrodes disposed thereon respectively. Either the first surface 5a or the second surface 5b may be represented as first or second.

A first conductive material 2a is connected to the first surface 5a of the semiconductor chip 5 and a second conductive material 2b is connected to the second surface b. The first conductive material 2a and the second conductive material 2b are respectively formed by plating, further, are covered with outer plating films 4 by plating so that the electrode with the five surfaces mentioned above is formed.

As shown in FIG. 2, the semiconductor chip 5 is positioned at nearly a center of longitudinal direction in the semiconductor device 1. Further, the semiconductor chip 5 is sandwiched between the first conductive material 2a and the second conductive material 2b which are connected to the first electrode 5a1 and the second electrode 5b1, respectively. Moreover, the pair of the conductive materials 2 is constituted to sandwich the encapsulating material 3 encapsulating the semiconductor chip 5.

As shown in FIG. 2 as the cross-sectional view, a first connection portion between the first electrode 5a1 and the second electrode 5b1 and a second connection portion between the first conductive material 2a and the second conductive material 2b are tapered from the plating film 4 towards the electrode of the semiconductor chip 5. However, any shape may be applicable about the connection portions.

Surface areas of the first surface 5a and the second surface 5b being configured the electrode of the semiconductor chip 5 thereon are larger than surface areas of the first conductive material 2a and the second conductive material 2b, respectively. The size of the semiconductor chip 5 mentioned above allows the semiconductor chip 5 to be configured in the center of the semiconductor device 1, so that the surrounding area of the semiconductor chip 5 is covered with the encapsulating material 3 to encapsulate the semiconductor chip 5.

A method for fabricating the semiconductor device according to the first embodiment of the present invention is explained by using FIGS. 3-8 being a cross-sectional diagrams of a work.

The first encapsulating material 3a having a feature mentioned below is prepared. The first encapsulating material 3a is melted totally to be flowed when heating up to a prescribed temperature, for example 130° C. Further heating up to 175° C., for example, the first encapsulating material 3a is hardened. The first encapsulating material 3a excels in mechanical processing, therefore, the first encapsulating material 3a can be molded as an arbitrary shape by pressing when the first encapsulating material 3a is flowed. Furthermore, only color can be changed without changing another property.

In the first embodiment of the present invention, the sheet-like encapsulating material 3 is used, however, another encapsulating material, for example, a liquid resin, a tablet resin or the like may be used. Moreover, a second encapsulating material 3b mentioned below as the same as the first encapsulating material 3a is also suitably used as the sheet-like encapsulating material or the like. In addition, a thickness of the first encapsulating material 3a is variously selected according to a thickness of the conductive materials 2 being connected between the semiconductor chips 5. The thickness of the sheet encapsulating material 3 influences on the outer sizes of the semiconductor device 1.

Figure 3:
FIG. 3 is a cross-sectional diagram of a work showing a method for fabricating the semiconductor device according to the first embodiment of the present invention.

As shown in FIG. 3, the first encapsulating material 3a is stuck on one side of a wafer W having the semiconductor element thereon, for example, using a laminator. The wafer W is a state before being divided into the semiconductor chips 5.

Figure 4:
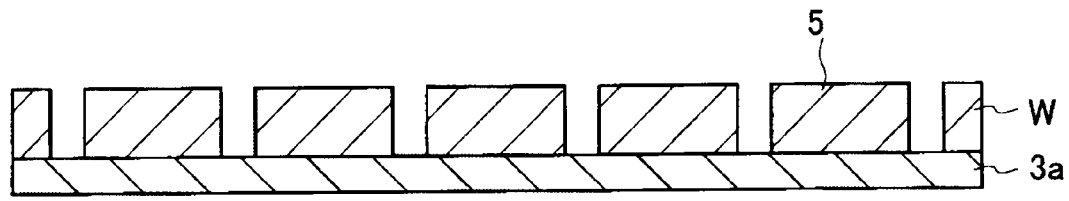
FIG. 4 is a cross-sectional diagram of the work showing the method for fabricating the semiconductor device according to the first embodiment of the present invention.

The wafer W having the first encapsulating material 3a thereon is diced by a blade to be divided into each semiconductor chip 5. Dicing is performed from the other surface of the wafer W without being stuck the first encapsulating material 3a to the one surface of the wafer W. As shown in FIG. 4, dicing is performed for only the wafer W not to cut the first encapsulating material 3a being stuck on the other surface of the wafer. As a result, the semiconductor elements formed on the wafer W is cut to be each of the semiconductor chips 5. However, the semiconductor chips 5 are fixed by the first encapsulating material 3a stuck on the other surface of the wafer so that the semiconductor chips 5 are not distributed.

Conventionally, after each of the semiconductor chips are aligned on the encapsulating material, the semiconductor chips are individually mounted by using a mounter. By using processing steps as shown in FIG. 3 and FIG. 4, the semiconductor chips are the same state as individually mounting by using the mounter. Accordingly, the mounter is not necessary. Therefore, processing time for disposing the semiconductor chip on the encapsulating material in the fabrication process of the semiconductor device can be shortened so that productivity improvement is obtained by being decreasing takt time.

In addition, conventional position accuracy in disposing the semiconductor chip on the encapsulating material is dependent on tool accuracy of the mounter. However, the semiconductor chip can be disposed on the encapsulating material by only cutting the wafer by the use of the processes mentioned above, therefore, the position accuracy is dependent on mask accuracy when the semiconductor element is formed on the wafer so that a great improvement of the position accuracy is anticipated.

Figure 5:
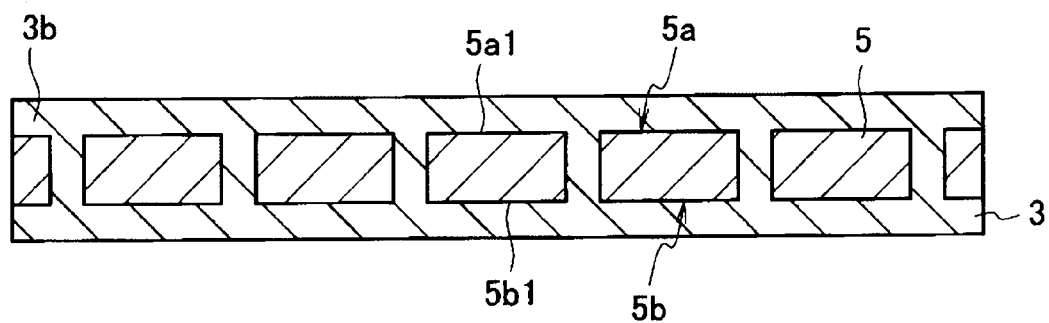
FIG. 5 is a cross-sectional diagram of the work showing the method for fabricating the semiconductor device according to the first embodiment of the present invention.

The second encapsulating material 3b being sheet-like, for example, is disposed on the other surface of the semiconductor chip 5 as shown in FIG. 4. In this condition, heating and pressing is carried out to sandwich the first encapsulating material 3a and the second encapsulating material 3b, using, for example, a thermal press tool so that the encapsulating material is melted to flow into between the adjacent semiconductor chips 5 to be subsequently hardened as a state as shown in FIG. 5. The first encapsulating material 3a and the second encapsulating material 3b are melted and hardened, as a result, one encapsulating material 3 covering a periphery of the semiconductor chip 5 is formed.

As shown in FIG. 5, the first electrode 5a1 and the second electrode 5b1 being configured on the first surface 5a and the second surface 5b of the semiconductor chip 5, respectively, are covered with encapsulating material 3 to be resin-encapsulated.

Figure 6:
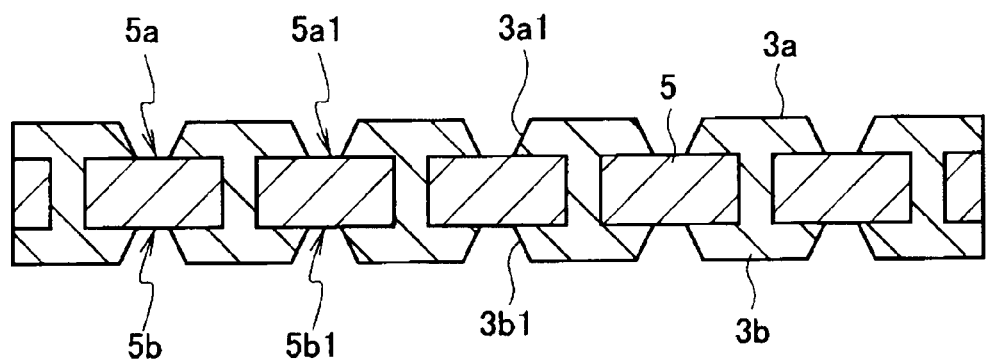
FIG. 6 is a cross-sectional diagram of the work showing the method for fabricating the semiconductor device according to the first embodiment of the present invention.
Figure 7:
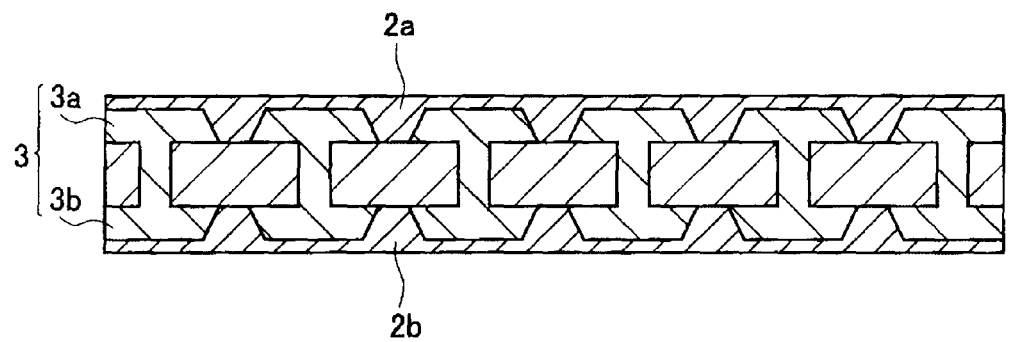
FIG. 7 is a cross-sectional diagram of the work showing the method for fabricating the semiconductor device according to the first embodiment of the present invention.
Figure 8:
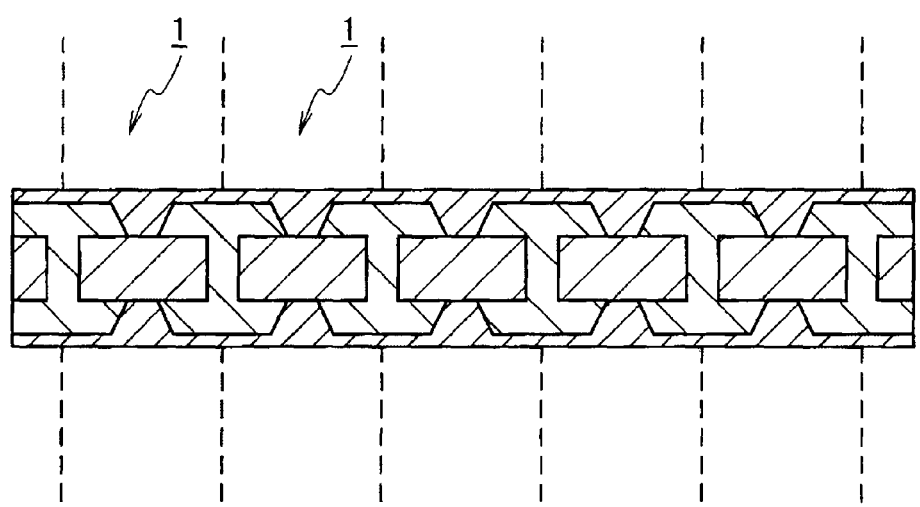
FIG. 8 is a cross-sectional diagram of the work showing the method for fabricating the semiconductor device according to the first embodiment of the present invention.

As shown in FIG. 6, after the semiconductor chip 5 is encapsulated in the encapsulating material 3 as shown in FIG. 5, a hole for connecting between the electrode configured on the surface of the semiconductor chip 5 and the conductive material is formed in the encapsulating material 3. In FIGS. 3-5, the first encapsulating material 3a encapsulating the semiconductor chip 5 is represented under the wafer W and the second encapsulating material 3b is represented above the wafer W. On the other hand, below FIG. 6, the encapsulated wafer W is inversely illustrated as convenience in explanation. In FIGS. 6-8, the encapsulating material 3 as shown under the semiconductor chip 5 is the second encapsulating material 3b and the encapsulating material 3 as shown over the semiconductor chip 5 is the first encapsulating material 3a.

A first hole 3a1 is formed in the first surface 5a of the encapsulating material 3 and a second hole 3b1 is formed in the second surface 5b of the encapsulating material 3, for example, by using a laser or a drill. The first hole 3a1 is formed to penetrate till the first electrode 5a1 configured with the first surface 5a of the semiconductor chip 5. The second hole 3b1 is formed to penetrate till the second electrode 5a1 configured with the second surface 5a of the semiconductor chip 5.

In the first embodiment of the present invention, the first hole 3a1 and the second hole 3b1 are respectively configured to be tapered towards the first electrode 5a1 and the second electrode 5b1 and retain a conduction passes between the conductive material and the two electrodes being the first electrode 5a1 and the second electrode 5b1. However, any shape may be applicable about the holes in a relation to characteristics of the semiconductor device 1.

As shown in FIG. 7, after the first hole 3a1 and the second hole 3b1 are configured with the first encapsulating material 3a and the second encapsulating material 3b as conduction passes, the first conductive material 2a and the second conductive material 2b are formed on the whole surface of the encapsulating material 3 by plating. The first conductive material 2a and the second conductive material 2b being suitably represented as the conductive materials 2 below is formed by via-filling plating method. For example, a first Cu film is formed by non-electrolytic plating and subsequently a Cu plug is selectively filled into the hole by electrolytic plating. Furthermore, a second Cu film is arbitrarily formed on the both front and back surfaces as outer electrodes. A Ni film or the like other than the copper film may be used as the conductive material 2 in consideration for mechanical and electrical characteristics of the semiconductor device 1.

Further, as shown as dashed lines in FIG. 8, a portion between adjacent semiconductor chips 5 being suitably called a street portion hereafter, is diced by a blade being narrower than the distance between the semiconductor chips 5. After forming an individual semiconductor device by cutting, an outer plating film 4 is formed on the first conductive material 2a and the second conductive material 2b, for example, by immersing a barrel plating solution or a solder plating solution as shown in FIG. 7 to complete the semiconductor device 1.

Furthermore, the plating may be carried out as forming a single film on the surfaces of the first conductive material 2a and the second conductive material 2b or as stacking a plurality of layers using silver plating or solder plating. Especially, the plating can protect the surface accompanying with improvement of wetting with a solder by using solder plating or nickel-tin plating as the outmost film when the semiconductor device 1 is connected to the substrate.

The semiconductor device according to the first embodiment of the present invention includes a structure without bonding wires by using the method for fabricating the semiconductor device mentioned above. Accordingly, electrical characteristics of the semiconductor device are improved to retain reliability and the method for fabricating the semiconductor device obtains shortening of the production time to improve productivity.

Moreover, when the semiconductor chip is disposed on the encapsulating material, the mount process mounting each of the semiconductor chip on the encapsulating material by using mounter can be omitted. As a result, decreasing the takt time and the improvement of the position accuracy can particularly be obtained to contribute to lowering a cost of the semiconductor device.

Further, the semiconductor device according to the first embodiment of the present invention uses the electrode with the five surfaces, therefore the semiconductor device also includes superior effects in the assembly processes. Other than the effects mentioned above, for example, the method can provide to visually confirm a solder connection state when the semiconductor device is configured on the substrate. For another example, a solder between the outer electrode and the substrate can be fully formed for a fillet to be decreased breakage failures at external force such as a bombardment.

Second Embodiment

Next, a semiconductor device according to a second embodiment of the present invention will be described below in detail with reference to FIGS. 9-15.

It is to be noted that the same or similar reference numerals are applied to the same or similar parts and elements throughout the drawings, and the description of the same or similar parts and elements will be omitted or simplified.

A semiconductor device 10 of the second embodiment is different from the semiconductor device 1 of the first embodiment in an outer shape and a method for fabricating the semiconductor device. As clearly shown as a cross-sectional view of the semiconductor device 10 in FIG. 9, the encapsulating material 3 encapsulating the semiconductor device 10 and the semiconductor chip 5 is formed in the semiconductor device 10. The encapsulating material 3 has a convex band C around four surfaces of the semiconductor device 10.

The electrode with the five faces is constituted with one surface opposed to the first surface 5a of the semiconductor chip 5 and four surfaces being perpendicular to the surface opposed to the first surface 5a, each of the four surfaces respectively sharing each of the four sides of the surface opposed to the first surface 5a. The plating film 4 is formed on the first conductive material 2a. The electrode with the five faces including the one face opposed to the second surface 5b is similarly constituted. As clearly shown in FIG. 1 of the first embodiment, each of the four faces is formed as a plane between the first surface 5a and the second surface 5b opposed to the first surface 5a.

Figure 9:
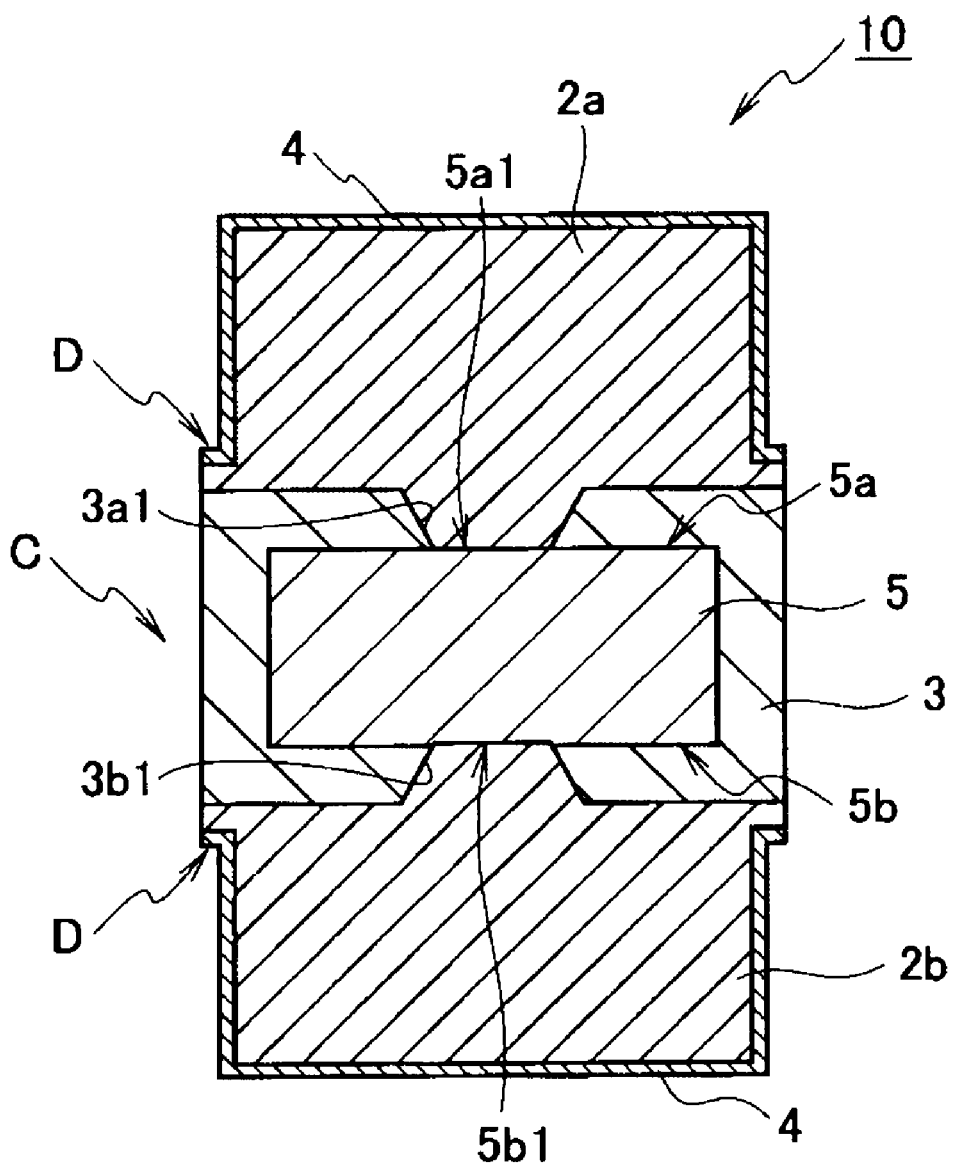
FIG. 9 is a cross-sectional view showing a semiconductor device according to a second embodiment of the present invention.

On the other hand, a convex band C is configured to surround a center portion of the four surfaces being formed as the planes in the semiconductor device 10 of the second embodiment semiconductor device 1. In the semiconductor device 10 as shown in FIG. 9, the step portion D is configured near a portion of the encapsulating material 3 which is contacted with the first conductive material 2a and the second conductive material 2b to expand towards an outer space from the semiconductor device 10. The step portion D surrounds the four faces of the semiconductor device 10 so that the convex band C is formed. The plating film 4 is formed to extend to the step portion D in the first conductive material 2a and the second conductive material 2b which are contacted with the encapsulating material 3 forming the convex band C. However, plating film 4 is not formed on portions of the first conductive material 2a and the second conductive material 2b which are formed as the same plane as the encapsulating material 3.

The semiconductor device 10 includes the semiconductor chip 5, the first electrode 5a1, the second electrode 5b1, the encapsulating material 3, the first conductive material 2a, the second conductive material 2b and a plating film. These parts are the same as those of the semiconductor device 1 in the first embodiment mentioned above. The first electrode 5a1 of the semiconductor element is configured on the first surface 5a and the second electrode 5b1 of the semiconductor element is configured on the second surface 5b opposed to the first surface 5a in the semiconductor chip 5. The encapsulating material 3 is heated to be melted and hardened so that the semiconductor chip 5 is encapsulated by the encapsulating material 3. The first hole 3a1 and the second hole 3b1 are configured in the encapsulating material 3 to expose the first electrode 5a1 and the second electrode 5b1. The first conductive material 2a is connected with the first surface 5a of the semiconductor chip 5 via the first hole 3a1, and the second conductive material 2b is connected with the second surface 5b of the semiconductor chip 5 via the second hole 3b1. The plating film covers the five surfaces without contacting to the first conductive material 2a and the second conductive material 2b.

Figure 10:
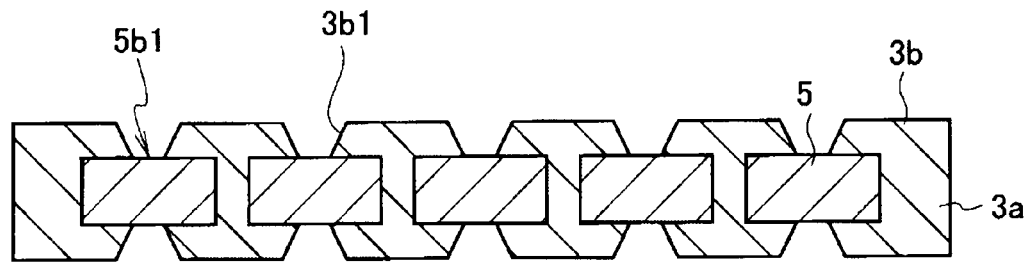
FIG. 10 is a cross-sectional diagram of a work showing a method for fabricating the semiconductor device according to the second embodiment of the present invention.

The convex band C is appeared by forming step portion D in the semiconductor device 10. This is because the method for fabricating the semiconductor device 10 as shown in FIGS. 10-15 is adopted. Further, a work as shown in FIG. 10 is fabricated by using the method as explained in the first embodiment as shown in FIG. 3-FIG. 6.

As shown in FIG. 3, the first encapsulating material 3a is stuck on one side of the wafer W being formed the semiconductor element thereon, for example, using a laminator. The wafer W is a state before being divided into the semiconductor chip 5.

The wafer W having the first encapsulating material 3a thereon is diced by a blade to be divided into each of the semiconductor chips 5. As shown in FIG. 4, dicing is performed from the other surface of the wafer W without being stuck the first encapsulating material 3a to the one surface of the wafer W. As shown in FIG. 4, dicing is performed for only the wafer W not to cut the first encapsulating material 3a being stuck on the other surface of the wafer.

As shown in FIG. 5, the second encapsulating material 3b being sheet-like, for example, is disposed on the other surface of the semiconductor chip 5. In the state, the first encapsulating material 3a and the second encapsulating material 3b are sandwiched by a thermal press tool, for example, to be heated and pressed. As a result, the encapsulating material is melted and flowed into a space between the adjacent semiconductor chips 5a to be hardened. Finally, the first electrode 5a1 and the second electrode 5b1 configured on the first surface 5a, and the second surface 5b of the semiconductor chip 5, respectively, are covered with the encapsulating material 3 to be encapsulated.

First, the semiconductor chip 5 is encapsulated by the encapsulating material 3 As shown in FIG. 10, subsequently the holes are formed in the encapsulating material 3 encapsulating the semiconductor chip 5 to connect between the electrode of the surface and the conductive material. As mentioned above, the first hole 3a1 and the second hole 3b1 of the encapsulating material 3 are respectively formed in the first surface 5a and the second surface 5b by using a laser or a drill, for example. Any shape may be applicable on the first hole 3a1 or the second hole 3b1 as mentioned in the first embodiment on the semiconductor device 1.

Figure 11:
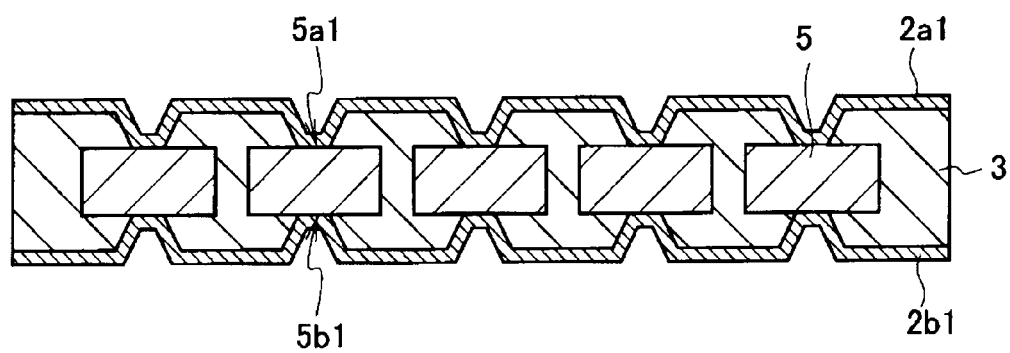
FIG. 11 is a cross-sectional diagram of the work showing the method for fabricating the semiconductor device according to the second embodiment of the present invention.

As shown in FIG. 11, a first plating is carried out to cover the first electrode 5a1, the second electrode 5b1 and the encapsulating material 3. A plating film 2a1 and a plating film 2b1 having a same thickness are formed on the first hole 3a1, the second hole 3b1 and the encapsulating material 3 by the first plating. Non-electrolytic plating, for example, is used as the first plating so that a Cu plating film is formed.

Figure 12:
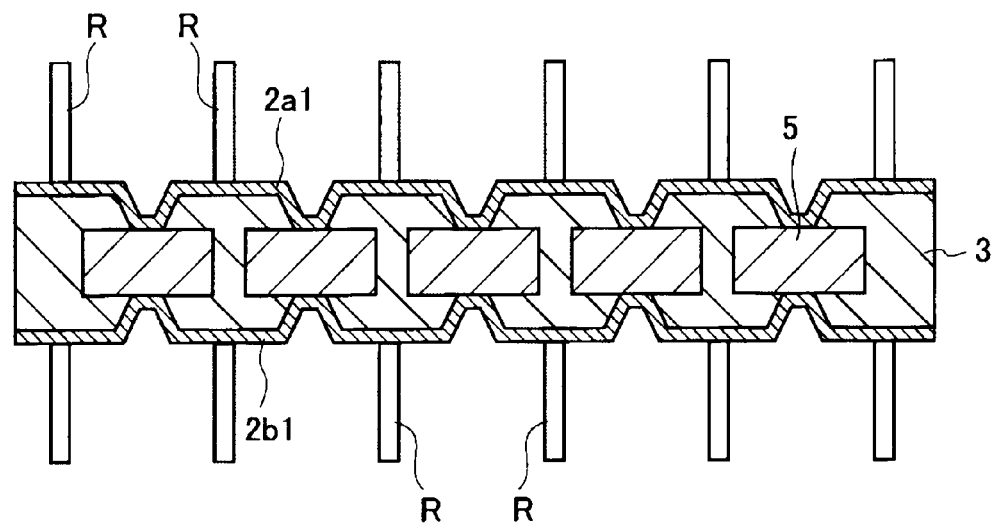
FIG. 12 is a cross-sectional diagram of the work showing the method for fabricating the semiconductor device according to the second embodiment of the present invention.

As shown in FIG. 12, a resist R is formed on the plating films 2a1 and 2b1 between the adjacent semiconductor chips 5 formed by the first plating. The portion between the adjacent semiconductor chips 5 is called a street portion. The resist R is configured on the work as a grid to cover the street portion. A portion surrounded by four sides using the resist R which is the grid is the conductive material 2. Further, a height of the resist R determines a thickness of the conductive material 2 formed by plating. Furthermore, when cutting by using a dicer as mentioned later, a concave formed by the resist R is a cutting portion.

Figure 13:
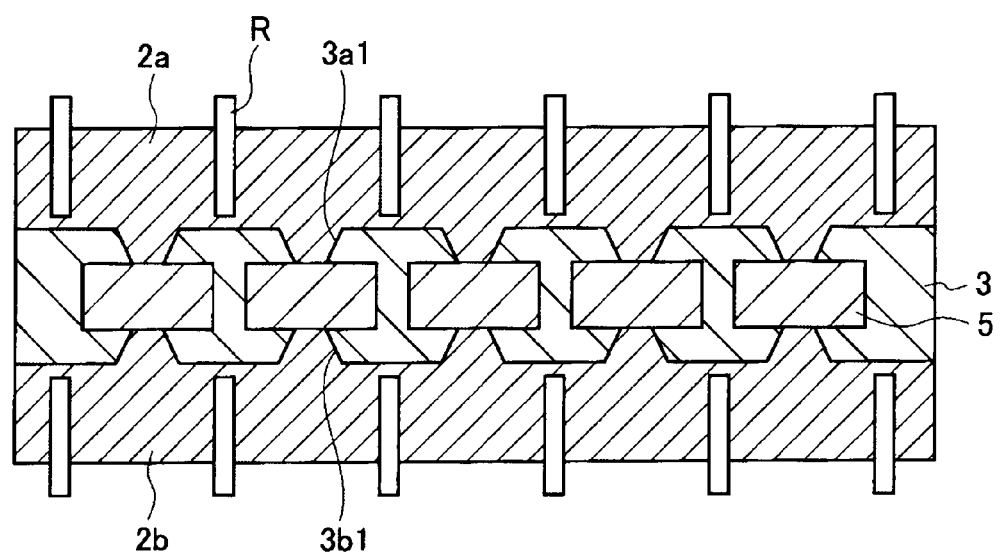
FIG. 13 is a cross-sectional diagram of the work showing the method for fabricating the semiconductor device according to the second embodiment of the present invention.

As shown in FIG. 13, after the resist R is formed, a second plating is carried out so that a Cu film is formed on the plating films 2a1 and 2b1. Non-electrolytic plating, for example, is used as the second plating so that a Cu plating film with a prescribed thickness is formed. The first conductive material 2a and the second conductive material 2b are formed by the second plating.

Furthermore, via-filling plating technique is used in the second plating. In the technique, the first hole 3a1 and the second hole 3b1 is filled by the via-filling plating technique, subsequently a plating is performed till a height of the first conductive material 2a and a height of the second conductive material 2b in each of the semiconductor devices 10 become a same level.

Figure 14:
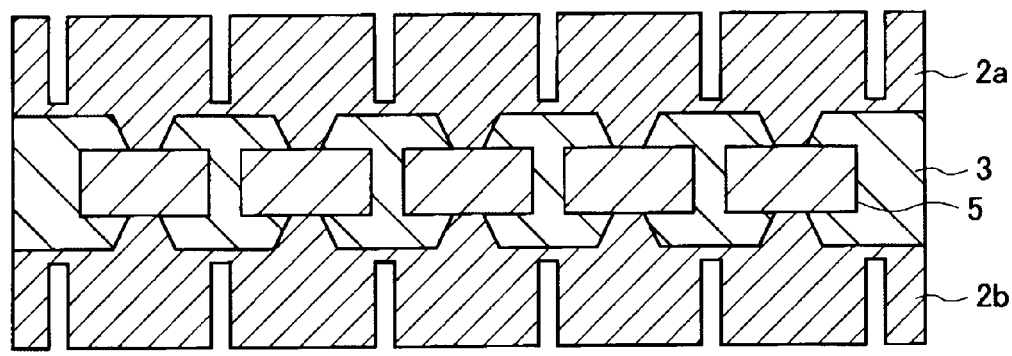
FIG. 14 is a cross-sectional diagram of the work showing the method for fabricating the semiconductor device according to the second embodiment of the present invention.

As shown in FIG. 14, the resist R is removed. The plating is not carried out at the portion of the resist. Accordingly, removing the resist R results in a state that the first conductive material 2a and the second conductive material 2b of the semiconductor device 10 is formed in the work. In other words, the concave being formed without plating is emerged at the street portion between the conductive materials 2 of the adjacent semiconductor devices 10. A third plating is carried out on the first conductive material 2a and the second conductive material 2b so that the outer plating film 4 is formed.

Figure 15:
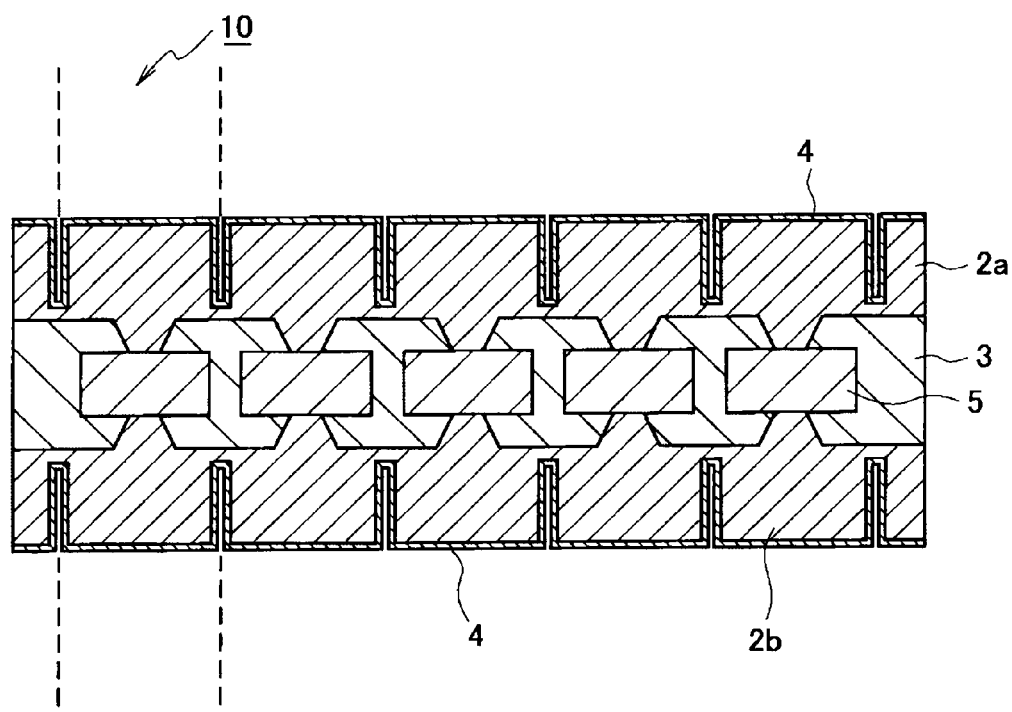
FIG. 15 is a cross-sectional diagram of the work showing the method for fabricating the semiconductor device according to the second embodiment of the present invention.

As shown in FIG. 15, the wafer W is cut into each of the semiconductor devices 10 by a dicer at the street portion between the adjacent semiconductor devices 10. A blade width of the dicer is narrower than the width of the street portion with the outer plating film 4. When the blade being larger than the width of the street portion is used, a thickness of the encapsulating material 3 encapsulating the semiconductor chip 5 becomes thinner in dividing into the semiconductor devices 10. Accordingly, the process may be undesirable for protecting the semiconductor chip or light blocking effect.

As shown in FIG. 9, a cutting surface becomes the same plane by cutting using the blade. However, the step portion D is occurred in portions of the first conductive material 2a and the second conductive material 2b without cutting by the blade. The step portion D emerges as the convex band C surrounding the four plane of the semiconductor device 10.

Furthermore, as the semiconductor device 10 is cut after the third plating, the portions of the first conductive material 2a and the second conductive material 2b being the same plane as the encapsulating material 3 is not plated as shown in FIG. 9 being the cross-sectional view. Accordingly, the plating film 4a being formed by the first plating are exposed at the encapsulating material 3 and two boundaries being the first conductive material 2a and the second conductive material 2b.

The semiconductor device according to the second embodiment of the present invention includes a structure without bonding wires by using the method for fabricating the semiconductor device mentioned above. Accordingly, electrical characteristics of the semiconductor device are improved and reliability of the semiconductor device is retained. Further, the method for fabricating the semiconductor device obtains shortening of the production time to improve productivity.

Furthermore, other than the effect mentioned above, the semiconductor device has superior effects in mounting by using the electrode with the five surfaces in the semiconductor device according to the second embodiment of the present invention. For example, the method can provide to visually confirm a solder connection state when the semiconductor device is configured on the substrate. As a solder can be fully formed as a fillet between the outer electrode and the substrate so that breakage failures can be decreased at external force such as a bombardment.

Third Embodiment

Next, a semiconductor device according to a third embodiment of the present invention will be described below in detail with reference to FIGS. 16-18.

It is to be noted that the same or similar reference numerals are applied to the same or similar parts and elements throughout the drawings, and the description of the same or similar parts and elements will be omitted or simplified.

A semiconductor device 20 according to the third embodiment has a constitution nearly being the same as that of the semiconductor device 10 according to the second embodiment. However, the semiconductor device 20 is different from the semiconductor device 10 on a point that a portion of a conductive material having the same plane as an encapsulating material is also plated.

As shown in FIG. 9, the convex band C is formed by the step portion D which is formed between the two conductive materials and the encapsulating material 3 in the semiconductor device 10, the two conductive materials being the first conductive material 2a and the second conductive material 2b. A plating film is not formed on a portion of the conductive material 2 which is contacted with the encapsulating material 3 and being formed as the same plane as the encapsulating material 3 by cutting. After removing the resist R as mentioned above, a concave is appeared in the street portion. The third plating is carried out including the concave to form the outer plating film 4. The concave is subsequently cut, therefore, the plating film is not formed on the portion of the conductive material 2.

Figure 16:
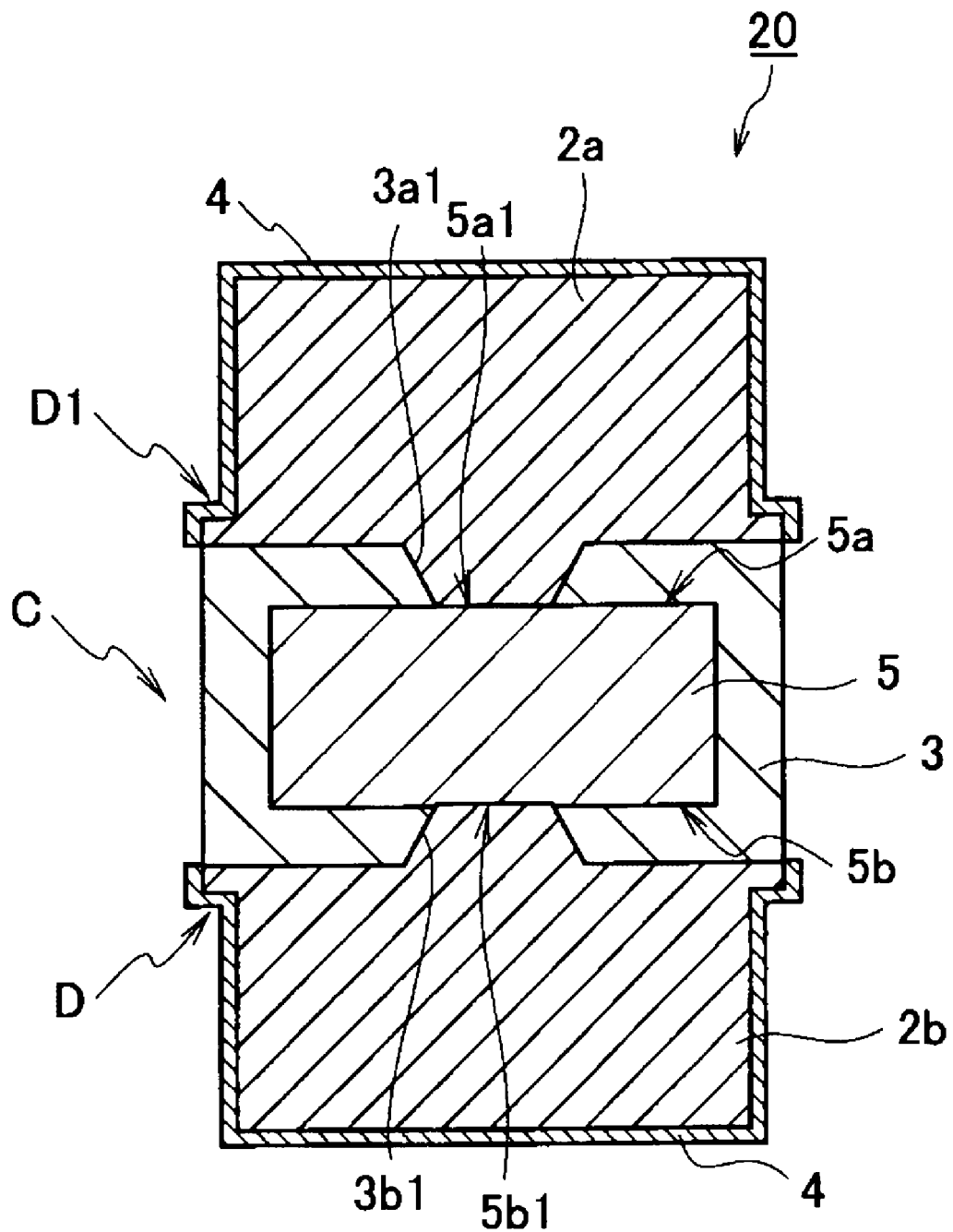
FIG. 16 is a cross-sectional view showing a semiconductor device according to a third embodiment of the present invention.

On the other hand, the convex band C is formed by the step portion D which is formed between the two conductive materials and the encapsulating material 3 in the semiconductor device 20, the two conductive materials being the first conductive material 2a and the second conductive material 2b as shown in FIG. 16. Accordingly, processing steps from the first plating and the second plating to removing the resist R in the semiconductor device 20 according to the third embodiment are the same as the processing steps in the semiconductor device 10 according to the second embodiment. A method for fabricating the semiconductor device 20 includes thermally pressing a wafer on the first encapsulating material 3a, dividing the wafer into semiconductor chips having a prescribed size by a dicer, thermally pressing the second encapsulating material 3b from the upper surface of the wafer to encapsulate the wafer and harden the encapsulating material, forming the first hole 3a1 exposing the first electrode 5a1 configured on the first surface 5a of the semiconductor chip 5 and the second hole 3b1 exposing the second electrode 5b1 configured on the second surface 5b of the semiconductor chip 5, performing the first plating to covering the first electrode 5a1, the second electrode 5b1, the first encapsulating material 3a and the second encapsulating material 3b, forming the resist R on the plating film formed between the adjacent semiconductor chips 5 after the first plating, performing the second plating to fill the conductive material in the first hole 3a1 and the second hole 3b1 and to form the first conductive material 2a and the second conductive material 2b, and removing the resist R.

However, a plating film is formed on a portion of the conductive material 2 which is contacted with the encapsulating material 3 and is formed as the same plane as the encapsulating material 3 by cutting. After cutting the portion formed and removed the resist between the adjacent semiconductor chips 5 by the dicer. The third plating is carried out to form the outer plating film 4 which cover the step portion D in the first conductive material 2a and the second conductive material 2b. The two conductive material 2a, 2b are respectively contacted with the first encapsulating material 3a and the second encapsulating material 3b and the step portion D1 in the first conductive material 2a and the second conductive material 2b. The step portion D is formed on the same plane as the first encapsulating material 3a and the second encapsulating material 3b forming the convex band C.

Figure 17:
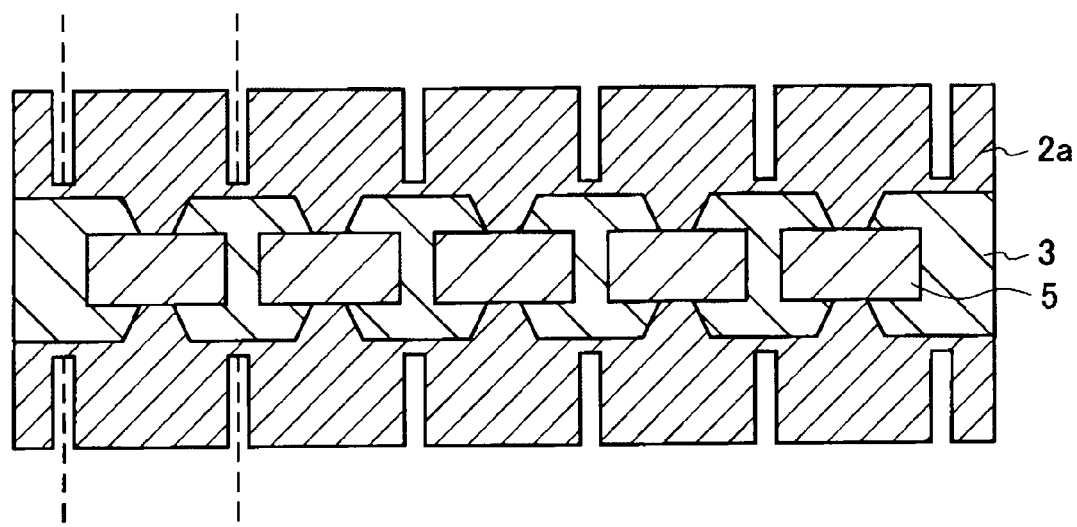
FIG. 17 is a cross-sectional diagram of a work showing a method for fabricating the semiconductor device according to the third embodiment of the present invention.

As shown in FIG. 17, the third plating is not immediately performed after removing the resist R. First, the concave of the exposed street portion is cut by using the dicer to individually divide into the semiconductor devices 20. Subsequently, the third plating is carried out by using barrel plating to form plating film. Therefore, the outer plating film 4 is formed on the conductive material 2 contacting with the encapsulating material 3 and constituting the convex band C.

The outer plating film 4 is formed on the conductive materials 2a, 2b constituting the convex band C by using the processing steps as shown in FIG. 16. Therefore, a step portion D1 having a thickness corresponding to the outer plating film 4 is generated between the encapsulating material 3 constituting the convex band C and the conductive material 2a.

Figure 18:
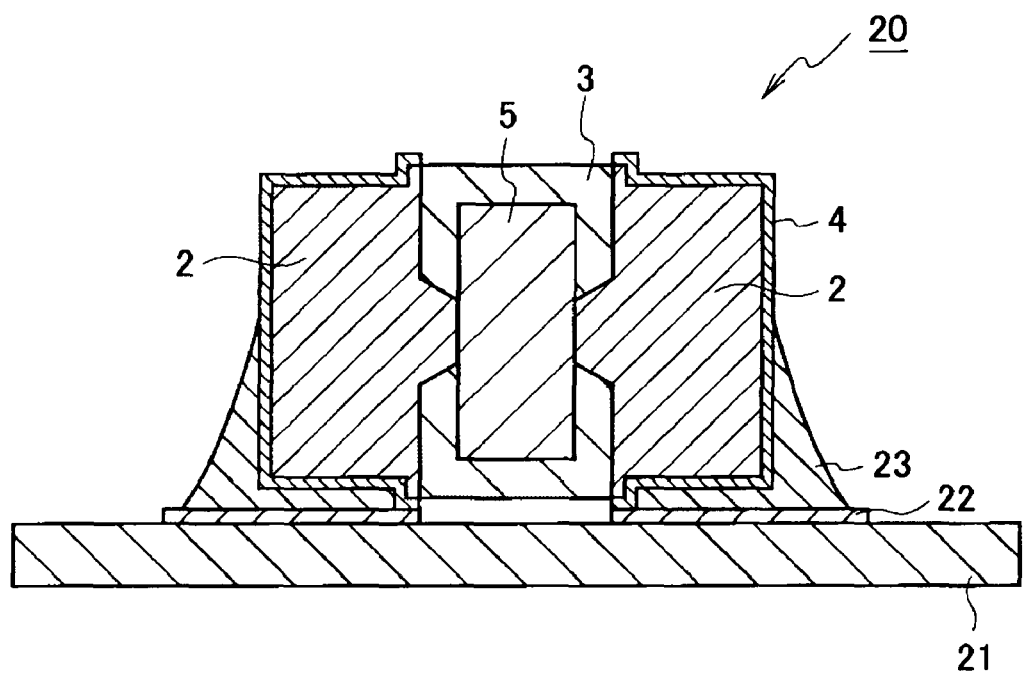
FIG. 18 is a cross-sectional diagram of the work showing a method for fabricating the semiconductor device according to the third embodiment of the present invention.

FIG. 18 is a cross-sectional view showing a state mounted the semiconductor device 20 according to the third embodiment of the present invention.

The electrode with the five surfaces being covered with the outer plating film 4 is disposed on a pattern 22 configured on a substrate 21 as shown in FIG. 18. Both of the electrode and the substrate 21 are electrically and physically connected with a solder 23.

In a case of the semiconductor device having a rectangular parallelepiped shape, for example, namely the conductive material 2 being formed as the same plane as the encapsulating material 3, the electrode is directly connected to the pattern 22 without a space between the substrate and the outer plating film 4 in mounting as mentioned above. In the case, a large amount of solder 23 is provided for the electrode positioned perpendicularly to the pattern 22, as dependence of the solder 23 in amount, when the solder 23 is provided on the electrode and pattern 22. Therefore, the solder 23 is not penetrated into between the electrode and the pattern 22. In another case, the penetrated solder 23 may be small in amount. In the state, for example, when the substrate 21 is bent, the substrate 21 is contacted to a surface of the semiconductor device opposed to the substrate 21 or a contact area between the electrode and the pattern 22 is decreased. These phenomena may lead to easily break the contact portion and to lower the substrate mounting strength.

Therefore, the step portion D1 having a thickness corresponding to the outer plating film 4 is formed between the encapsulating material 3 constituting the convex band C and the conductive material 2 in the semiconductor device 20 according to the third embodiment as mentioned above. As shown in FIG. 18, the step portion D1 is contacted to the pattern 22 in mounting the semiconductor device 20 onto the substrate 21. The step portion D is not directly contacted with the pattern 22 to form a space between the pattern 22 and the outer plating film 4. When the solder 23 is provided, the solder 23 is penetrated between the pattern 22 and the step portion D to strongly connect between the semiconductor device 20 and the substrate 21. As a result, lowering substrate mounting strength can be avoided.

As the plating film 4 is formed on an overall region of the exposed conductive material 2 in the semiconductor as shown in FIG. 16, lowering substrate mounting strength can be avoided in the mounting process of the semiconductor device on the substrate. Furthermore, the semiconductor device includes a structure without bonding wires by using the method for fabricating the semiconductor device mentioned above. Accordingly, electrical characteristics of the semiconductor device are improved and reliability of the semiconductor device is retained. Further, the method for fabricating the semiconductor device obtains shortening of the production time to improve productivity.

Further, as the semiconductor device according to the third embodiment of the present invention uses the electrode with the five surfaces, the semiconductor device also includes superior effects in the mounting processes. Other than the effects mentioned above, for example, the method can provide to visually confirm the solder connection state when the semiconductor device is configured on the substrate. For another example, the solder between the outer electrode and the substrate can be fully formed for a fillet to be decreased breakage failures by external force such as bombardment.

Fourth Embodiment

Next, a semiconductor device according to a fourth embodiment of the present invention will be described below in detail with reference to FIGS. 19-22.

It is to be noted that the same or similar reference numerals are applied to the same or similar parts and elements throughout the drawings, and the description of the same or similar parts and elements will be omitted or simplified.

The semiconductor device 20 according to the third embodiment is explained as the method to avoid degradation of the mounting strength in connecting between the semiconductor device and the substrate. A semiconductor device 31 according to the fourth embodiment is also shown on an effect of degradation of the mounting strength.

Figure 19:
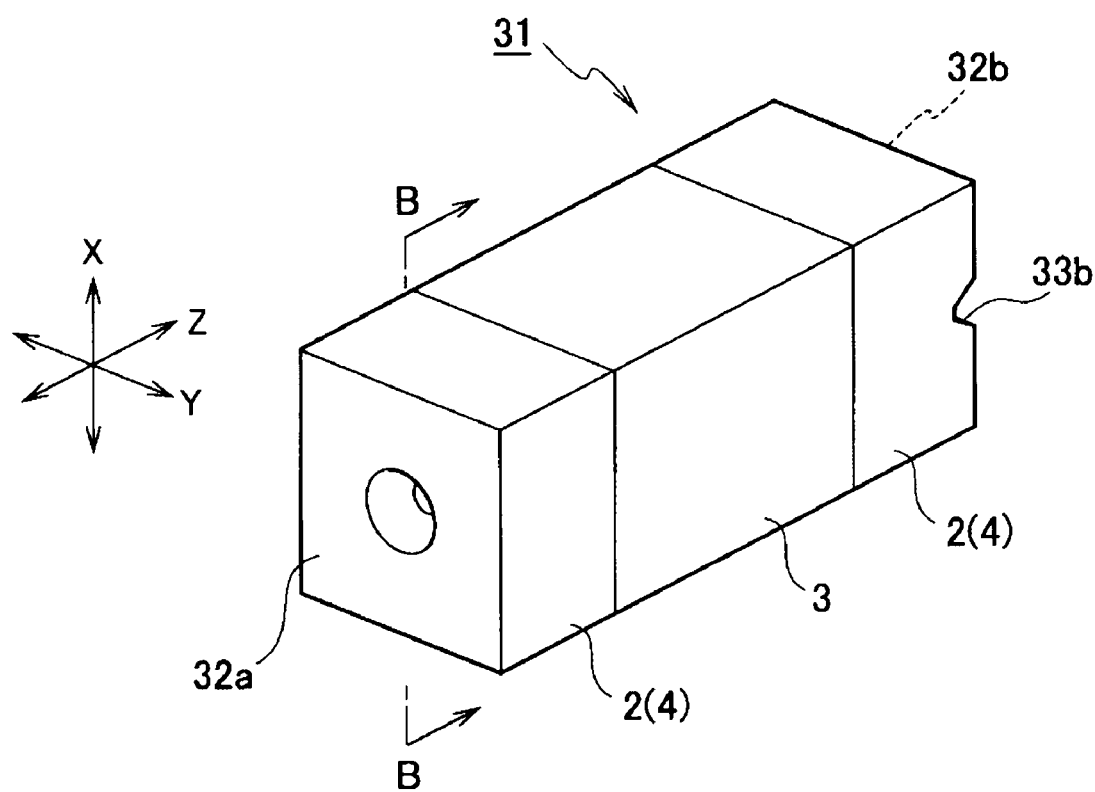
FIG. 19 is a perspective view showing a semiconductor device according to a fourth embodiment of the present invention.

The semiconductor device 31 according to the fourth embodiment has the electrode with the five surfaces and has the same constitution as that of the semiconductor device 20 according to the third embodiment. However, the semiconductor device 31 is different from each of the semiconductor devices in the embodiments as mentioned above on a point that concaves 33*a* and 33*b* are respectively formed on surfaces 32*a* and 32*b* in the five surfaces being the electrode. The surfaces 32*a* and 32*b* are respectively opposed to the first surface 5*a* and the second surface 5*b* of the semiconductor chip 5 and are not contacted with the encapsulating material 3. As shown in FIG. 19, the concaves 33*a* and 33*b* are respectively formed on the surfaces 32*a* and 32*b* in a perspective view totally illustrated as the semiconductor device 31.

Figure 20:
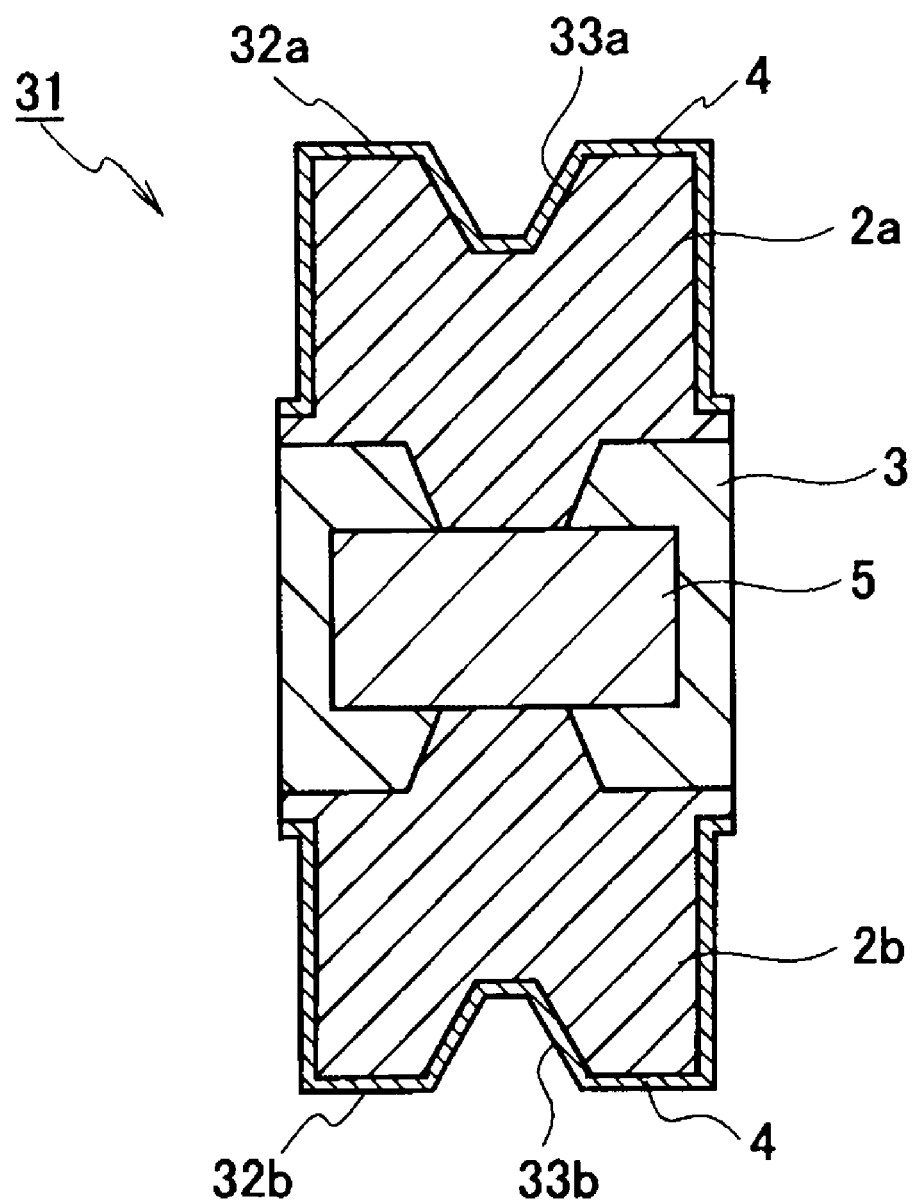
FIG. 20 is a cross-sectional view along line B-B in FIG. 19 showing the semiconductor device according to the fourth embodiment of the present invention.

FIG. 20 is a cross-sectional view showing the semiconductor device 31 along line B-B as shown in FIG. 19. As shown in the cross-sectional view of the semiconductor device 31, the concave s 33*a* and 33*b* are respectively formed on the first conductive material 2*a* and the second conductive material 2*b*. A method for fabricating the semiconductor device 31 is mentioned below, however, is partway the same as the method for fabricating the semiconductor device 10 in the second embodiment.

The method for fabricating the semiconductor device 31 includes thermally pressing the wafer on the first encapsulating material 3*a*, dividing the wafer into the semiconductor chips with prescribed size by a dicer, thermally pressing the second encapsulating material 3*b* from the upper surface of the wafer to encapsulate the semiconductor chips and harden the second encapsulating material 3, forming the first hole 3*a*1 exposing the first electrode 5*a*1 configured on the first surface 5*a* of the semiconductor chip 5 and the second hole 3*b*1 exposing the second electrode 5*b*1 configured on the second surface 5*b* of the semiconductor chip 5, performing the first plating to cover the first electrode 5*a*1, the second electrode 5*b*1, the first encapsulating material 3*a* and the second encapsulating material 3*b*, forming the resist R on the plating film formed by the first plating between the adjacent semiconductor chips 5, performing the second plating to fill the conductive material in the first hole 3*a*1 and the second hole 3*b*1 and forming the first conductive material 2*a* and the second conductive material 2*b*. The method for fabricating the semiconductor device 31 till these steps mentioned above is the same as the method for fabricating the semiconductor device 10 in the second embodiment.

On the other hand, a via-filling plating is not used in the second plating but used a conformal plating. The plating film without filling the hole and with the same thickness as other plating region is formed by using the conformal plating unlike the via-filling plating. Therefore, the concaves 33*a* and 33*b* fitting to the first hole 3*a*1 and the second hole 3*b*1 are respectively formed on the surfaces 5*a*, 5*b* of the semiconductor chip 5.

Figure 21:
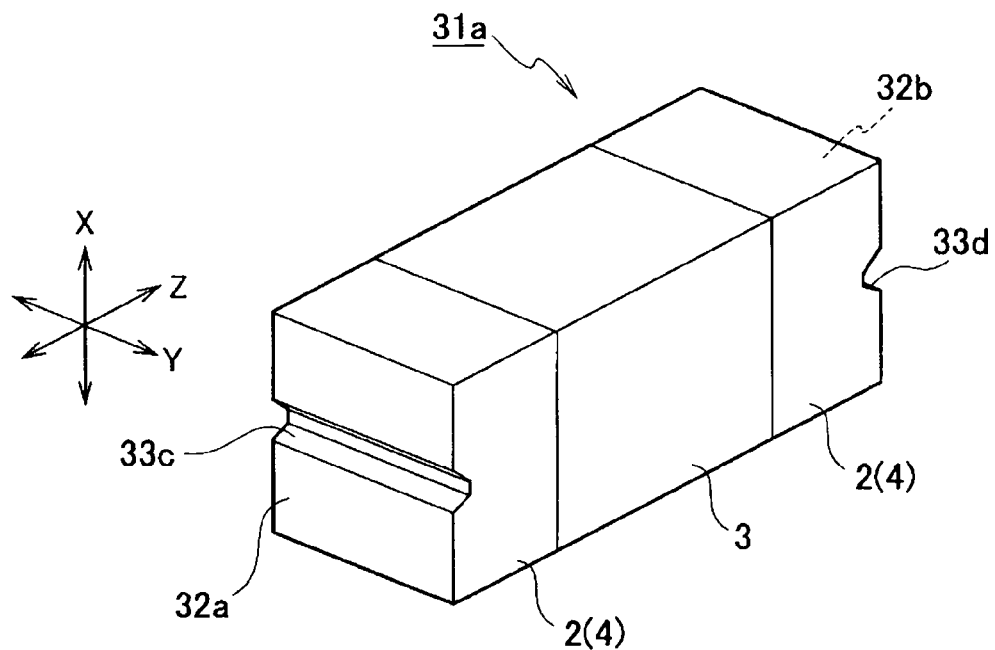
FIG. 21 is a perspective view showing another semiconductor device according to the fourth embodiment of the present invention.

Further, subsequently removing the resist R, performing the third plating to form the plating film 4 covering the first conductive material 2*a* and the second conductive material 2*b* and cutting a portion between the adjacent semiconductor chips 5 formed and removed the resist R by using the dicer complete the method for fabricating the semiconductor device 31 as shown in FIG. 21.

The semiconductor device 31 may be mounted on the substrate as shown in FIG. 18 as mentioned above. A solder is used to electrically connect between the semiconductor device 31 and the substrate or the semiconductor device 31 and the pattern. The solder penetrates into the concaves 33*a* and 33*b* like as a wedge to mechanically connect between the semiconductor device 31 and the substrate by strong force.

The semiconductor device according to the fourth embodiment includes a structure without bonding wires by using the method for fabricating the semiconductor device mentioned above. Accordingly, the semiconductor device is improved electrical characteristics and retains reliability, and the method for fabricating the semiconductor device obtains shortening of the production time to improve productivity. Especially, the concave is configured in the surface perpendicularly to a plate formed on the substrate so that the solder penetrates into the concave in mounting the semiconductor device on the substrate. Therefore, the semiconductor device can be mechanically fixed to the substrate, which leads to be able to effectively prevent mounting strength of the substrate from lowering.

In the third embodiment, the concaves 33*a* and 33*b* formed in the semiconductor device 31 are mortar-like concaves tapered to Z-axis as shown in FIG. 19. A shape of the concave may be arbitrarily determined in relation to mounting strength.

Figure 22:
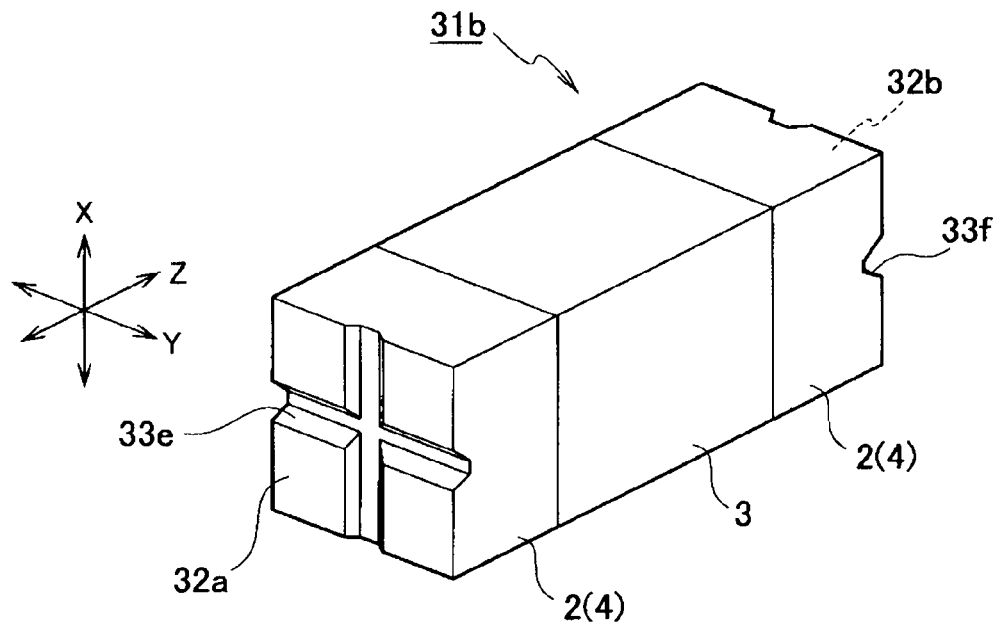
FIG. 22 is a perspective view showing another semiconductor device according to the fourth embodiment of the present invention.

For example, concaves 33*c* and 33*d* are configured in a straight line to Y axis as shown in FIG. 21. For example, not only the concave s 33*c* and 33*d* in a straight line to Y-axis but concave s 33*e* and 33*f* are configured in a straight line to X-axis to form a cross shape in a semiconductor device 31*b* as shown in FIG. 22. Furthermore, a singular concave or a plurality of the concaves may be formed to Z-axis. Especially, in the case of the cross shape, any direction can be used in mounting the substrate without consideration on a direction of the semiconductor device due to the concave position. Accordingly, efficiency on mounting the semiconductor device on the substrate is improved so that fabricating time can be shortened.

Furthermore, a depth of the concave may be formed when electrical connection to the electrode of the semiconductor chip is not inhibited.

Furthermore, the plating is used to form the concave in the semiconductor device of the fourth embodiment, however, a dicer, for example, is also used to form the concave in the first conductive material 2*a* and the second conductive material 2*b*.

Furthermore, the structure having the convex band C can be used in the semiconductor device of the fourth embodiment. The structure is used in the semiconductor devices of the second and third embodiments.

Fifth Embodiment

Next, a semiconductor device according to a fifth embodiment of the present invention will be described below in detail with reference to FIGS. 23-28.

It is to be noted that the same or similar reference numerals are applied to the same or similar parts and elements throughout the drawings, and the description of the same or similar parts and elements will be omitted or simplified.

The semiconductor device according to the fifth embodiment has the same structure as the semiconductor device according to the first embodiment. Furthermore, a method for fabricating the semiconductor device according to the fifth embodiment is the same as the method for fabricating the semiconductor device according to the first embodiment in providing a process without mount equipment. However, a feature of the fifth embodiment is partially modified as compared to the semiconductor device fabricated by the method according to the first embodiment.

The method for fabricating the semiconductor device according to the first embodiment mentioned above includes sticking an encapsulating material on one surface of the wafer W, subsequently cutting the wafer W to individuate into the semiconductor chips. A work being constituted with the wafer W and the encapsulating material is heated in the sticking. As the two thermal expansion coefficients are largely different each other, generation of warpage in the work can be considered during a cooling step.

The generation of warpage in the work causes obstacles in transferring between equipments for fabricating the semiconductor devices. Furthermore, difficulties are also generated in adsorbing the work and transferring the work to a cutting portion in dividing the wafer into the semiconductor chips. In addition, the wafer W may be broken or a micro-crack not to be confirmed by bare eyes, for example, may be generated in the wafer W accompanying with being increased with the warpage. As phenomena mentioned above become larger obstacles in the fabricating process of the semiconductor device, therefore, the warpage of the work is prevented as possible.

The method for fabricating the semiconductor device according to the fifth embodiment is explained by using a cross-sectional view as shown in FIGS. 23-28.

Figure 23:
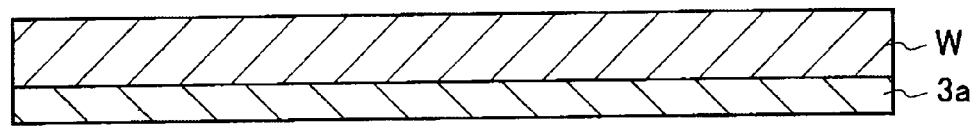
FIG. 23 is a cross-sectional diagram of a work showing a method for fabricating the semiconductor device according to a fifth embodiment of the present invention.

As shown in FIG. 23, one surface of first encapsulating material 3a is tentatively fixed on the wafer W by using a laminator. Here, the first encapsulating material 3a is not hardened but is tentatively fixed. Because warpage is generated in the work when the first encapsulating material 3a is hardened in this state.

Figure 24:
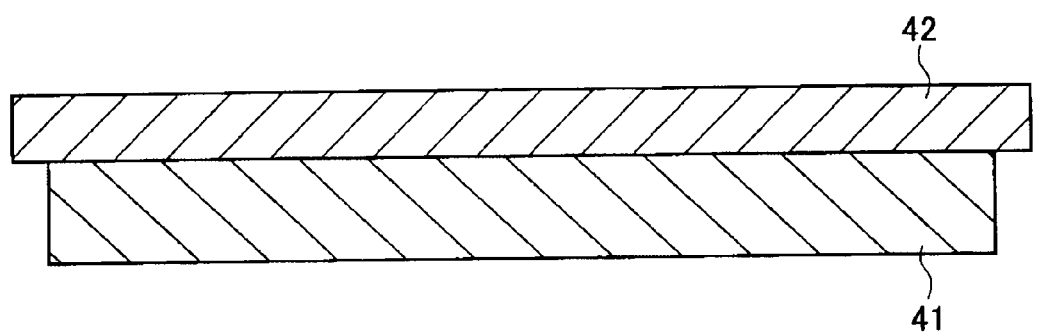
FIG. 24 is a cross-sectional diagram of the work showing the method for fabricating the semiconductor device according to the fifth embodiment of the present invention.

As shown in FIG. 24, one surface of a double-faced adhesive sheet 42 is stuck on a supporting material 41 accompanying with preparing the work. The supporting material 41 is a glass wafer, for example. However, a supporting material with lower strength is not used as the supporting material 41. The fifth embodiment has a feature that the warpage of the work being constituted with the wafer and the encapsulating material is prevented by sticking to the supporting material as mentioned later. Therefore, a thickness to suppress the warpage is necessary. Further, the supporting material having a capability to transparence for ultraviolet light (UV light) is necessary when the double-faced adhesive sheet is peeled by radiation of the UV light mentioned later. The glass wafer is used as the supporting material in the fifth embodiment. Accordingly, the supporting material 41 can be arbitrarily selected in accordance with the feature of the double-faced adhesive sheet 42.

On the other hand, the double-faced adhesive sheet 42, for example, is a sheet easily being peeled off from the stuck material by irradiation of the UV light. Any sheet can be used under being able to tolerate the heating temperature in hardening process on the encapsulating material 3 as mentioned later. As mentioned above, other than the sheet being able to be peeled by irradiating ultra-violet light more than constant amount, here lists a sheet being able to be peeled by heating more than predetermined amount, a sheet being able to be peeled by irradiating laser beam, a sheet being able to be peeled by immersing into a particular solution, or the like.

It is explained by using the double-faced adhesive sheet 42 as an example, however, the double-faced adhesive sheet 42 is not necessary as a sheet-like shape from the beginning in the fabrication process. For example, a coating process using a solution being able to be peeled again by solidification after coating may be used when the process can prevent the substrate from the warpage.

Figure 25:
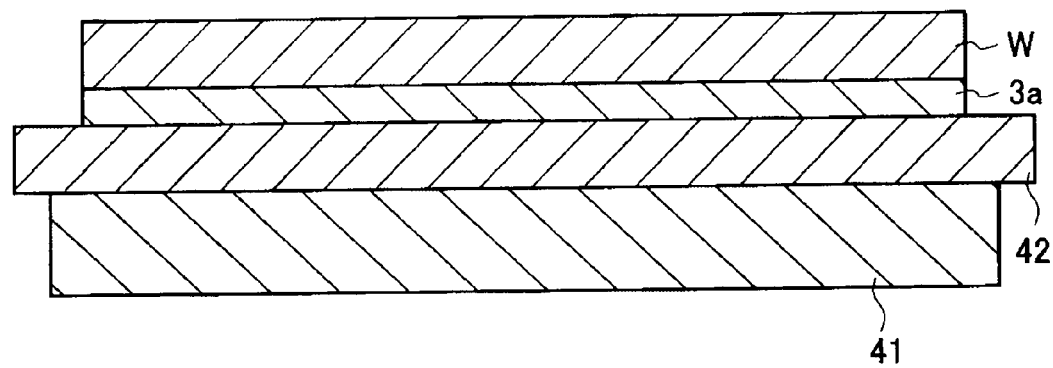
FIG. 25 is a cross-sectional diagram of the work showing the method for fabricating the semiconductor device according to the fifth embodiment of the present invention.

As shown in FIG. 25, the other surface of the first encapsulating material 3a in the work is stuck on the double-faced adhesive sheet 42 of the supporting material 41. A laminator is used in the sticking process, for example. Furthermore, the work integrating the supporting material 41, the double-faced adhesive sheet 42, the first encapsulating material 3a and the wafer W is heated and pressed to harden the first encapsulating material 3a. The warpage of the work is prevented even when the work is removed after the hardening process. The double-faced adhesive sheet 42 sticking between the supporting material 41 and the first encapsulating material 3a with the wafer W prevents the work from generation of the warpage.

Figure 26:
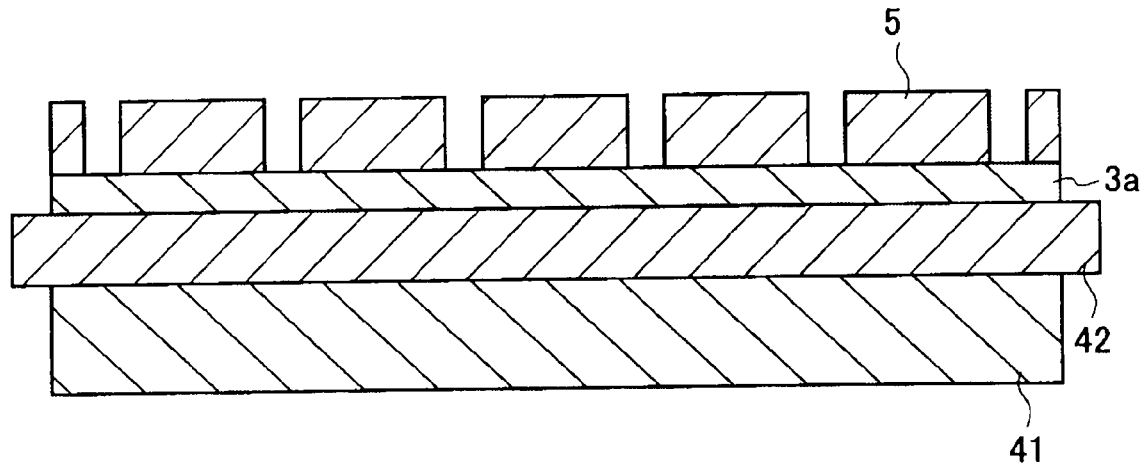
FIG. 26 is a cross-sectional diagram of the work showing the method for fabricating the semiconductor device according to the fifth embodiment of the present invention.
Figure 27:
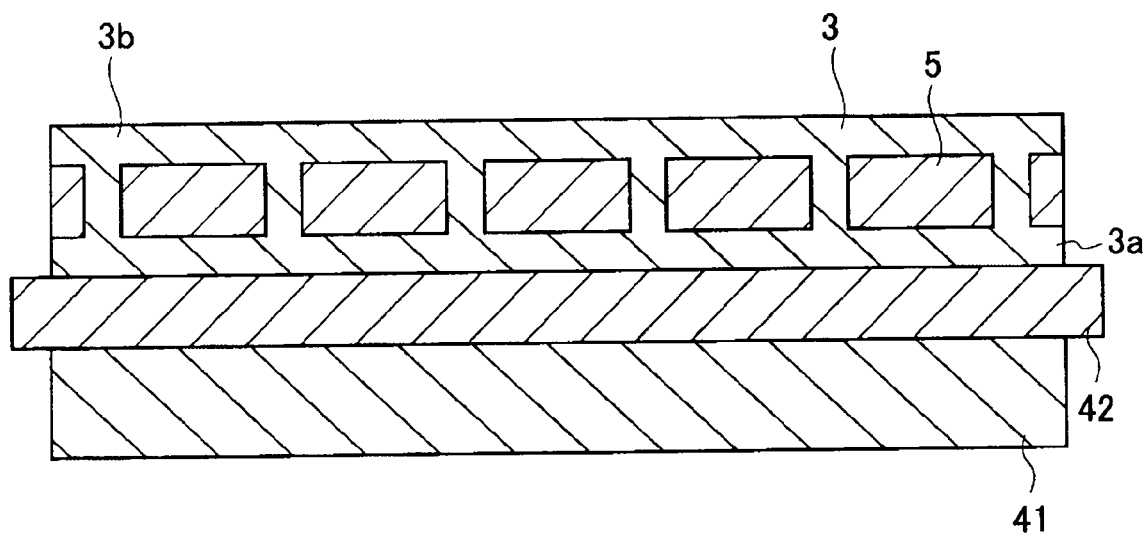
FIG. 27 is a cross-sectional diagram of the work showing the method for fabricating the semiconductor device according to the fifth embodiment of the present invention.

As shown in FIG. 26, only the wafer W is cut till the contact surface with the first encapsulating material 3a by a dicer from the other surface of the wafer W, which the first encapsulating material 3a is not stuck, towards the one surface of the wafer W. As shown in FIG. 27, the second encapsulating material 3b is disposed on the other surface of the wafer W to encapsulate and harden by thermocompression. As the second encapsulating material 3b is melted by the heating and the pressing in this process, the encapsulating material 3 is filled in the street portion which is formed by cutting to individuate into each semiconductor chip. The second encapsulating material 3b is hardened by cooling with accompanying this state. The semiconductor chips 5 are encapsulated with the second encapsulating material 3b by hardening the encapsulating material 3.

Figure 28:
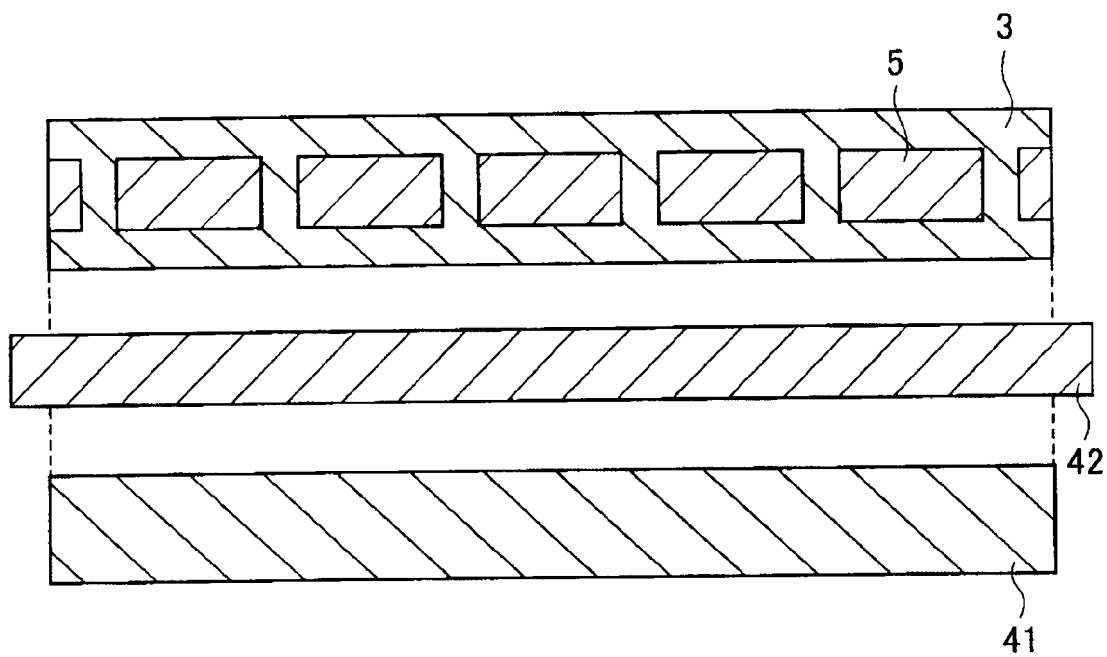
FIG. 28 is a cross-sectional diagram of the work showing the method for fabricating the semiconductor device according to the fifth embodiment of the present invention.

The double-faced adhesive sheet 42 and the supporting material 41 are peeled from the semiconductor chips 5 encapsulated. The sheet used in the processing steps has a characteristic being weakened by irradiating the UV light as the double-faced adhesive sheet 42. Accordingly, The UV light is irradiated from the supporting material 41 side. As shown in FIG. 28, the work is separated into the three portions, the semiconductor chips 5 encapsulated, the double-faced adhesive sheet 42 and the supporting material 41 by the irradiation.

The subsequent processing steps are the same as the processing steps of the semiconductor device 1 in the first embodiment, for example. The processing steps includes forming the first hole 3a1 in the first encapsulating material 3a and the second hole 3b1 in the second encapsulating material 3b to expose the first electrode 5a1 and the second electrode 5b1 respectively formed on the first surface 5a and the second surface 5b in the semiconductor chips 5, performing the first plating which the first conductive material 2a and the second conductive material 2b is formed to fill the first hole 3a1 and the second hole 3b1 and to cover the first encapsulating material 3a and the second encapsulating material 3b, cutting between the adjacent semiconductor chips 5 to individuate into the semiconductor chips 5 and performing the second plating which forms the outer plating film 4 in the first conductive material 2a and the second conductive material 2b to complete semiconductor device 1.

As mentioned above, disadvantages produced by the warpage of the wafer being stuck with the encapsulating material can be avoided. Furthermore, the semiconductor device includes a structure without bonding wires by using the method for fabricating the semiconductor device with avoiding the disadvantages mentioned above. Accordingly, electrical characteristics of the semiconductor device are improved and reliability of the semiconductor device is retained. Further, the method for fabricating the semiconductor device obtains shortening of the production time to improve productivity.

Furthermore, the fifth embodiment can be solved on the warpage of the work mutually generated from the first embodiment to the fourth embodiment. Therefore, the processing steps after FIG. 28 can be applicable to the process steps and the structure from the first embodiment to the fourth embodiment mentioned above.

Furthermore, as the semiconductor device according to the fifth embodiment of the present invention uses the electrode with the five surfaces, the semiconductor device also includes superior effects in the mounting processes. Other than the effects mentioned above, for example, the method can provide to visually confirm a solder connection state when the semiconductor device is configured on the substrate. For another example, the solder between the outer electrode and the substrate can be fully formed for a fillet to be decreased breakage failures by external force such as bombardment.

Sixth Embodiment

Next, a semiconductor device according to a sixth embodiment of the present invention will be described below in detail with reference to FIGS. 29-33.

It is to be noted that the same or similar reference numerals are applied to the same or similar parts and elements throughout the drawings, and the description of the same or similar parts and elements will be omitted or simplified.

The semiconductor device according to the sixth embodiment has the same structure as the semiconductor device according to the first embodiment. Furthermore, a method for fabricating the semiconductor device according to the sixth embodiment is the same as the method for fabricating the semiconductor device according to the first embodiment in providing a process without mount equipment. However, a feature of the sixth embodiment is partially modified as compared to the semiconductor device fabricated by the method according to the first embodiment.

The method for fabricating the semiconductor device according to the first embodiment mentioned above includes sticking an encapsulating material on one surface of the wafer W, subsequently cutting the wafer W to individuate into the semiconductor chips as shown in FIGS. 3 and 4. A residual encapsulating material for protecting the side surface of the semiconductor chip in the completed semiconductor device is necessary in the cutting process. A blade, for example having 0.15 mm width, being wider than a blade used in a conventional dividing process, is used in a dicing process.

However, loads to the blade and the wafer are increased with increasing a cut-volume as influences of the blade on the wafer or the wafer on the blade in the cutting process by using the blade being wider than the conventional blade. Accordingly, degradation speed of the blade and overloading to the blade and the wafer due to the load increase are increased so that chipping generated in the semiconductor chips is increased. Furthermore, using the wider blade poses retard of feeding speed of the wafer W as compared to the cutting process using the conventional blade. Therefore, great decrease of a takt time in the fabricating process may be difficult.

In the sixth embodiment, the fabricating process are alternatively proposed for being the semiconductor chips prevented from the chipping in the individuating instead of the fabricating process of the semiconductor device which are the sticking the encapsulating material on the one surface of the wafer W and subsequently cutting the wafer W to individuate into the semiconductor chips as explained using FIGS. 3 and 4. The fabricating process alternatively proposed is explained by using FIGS. 29-33.

The wafer W is tentatively fixed on a dicing sheet 51 and subsequently the wafer W is cut to be each semiconductor chip 5. The blade 52 cutting the wafer W is conventionally used in a mass production line and is 0.03-0.05 mm thick, for example. The feeding speed of the wafer W is 60 mm/sec, for example, in the cutting process of the wafer W by using the blade 52. Consequently, the speed of the process can be higher than using the wider blade.

Figure 29:
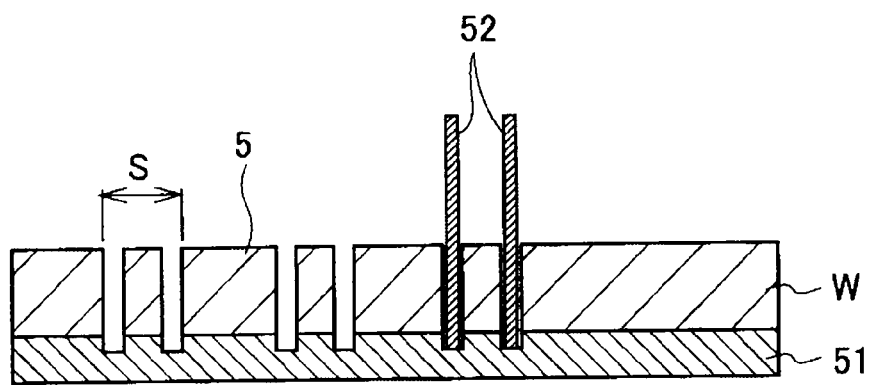
FIG. 29 is a cross-sectional diagram of a work showing a method for fabricating a semiconductor device according to the sixth embodiment of the present invention.

As shown in FIG. 29, a blade 52 in the street portion S is set between the adjacent semiconductor chips 5 to cut into the adjacent semiconductor chip. Two of the blades 52 are illustrated in FIG. 29 as an explanation. In a case of the semiconductor chip 5 being 0.2 mm wide, the street portion S being 0.15 mm wide and the blade 52 being 0.03 mm, for example, the blade 52 is set in the street portion S to cut to be the semiconductor chips 5 to retain 0.2 mm width of the semiconductor chip 5. Accordingly, the blade 52 of 0.03 mm width is twice set in the street portion S to leave the wafer W of 0.09 mm width in the street portion S.

Next, an adhesive film 53 with an adhesive layer 53b configured on a body 53a is framed as a semiconductor chip disposing portion E disposing the semiconductor chip 5 and the street portion S between the adjacent semiconductor chip disposing portions E by only cutting the adhesive layer 53b. In this step, only the adhesive layer 53b is cut but the body 53a is not cut. The adhesive film 53 used in the step is generally a film-like junction agent being called as DAF (Die Attach Film). The junction agent is conventionally used instead of a solder when the semiconductor chip is mounted on the body, for example, a frame or a substrate. As various kinds of the DAFs are provided in a market, any DAF can be freely used.

Figure 30:
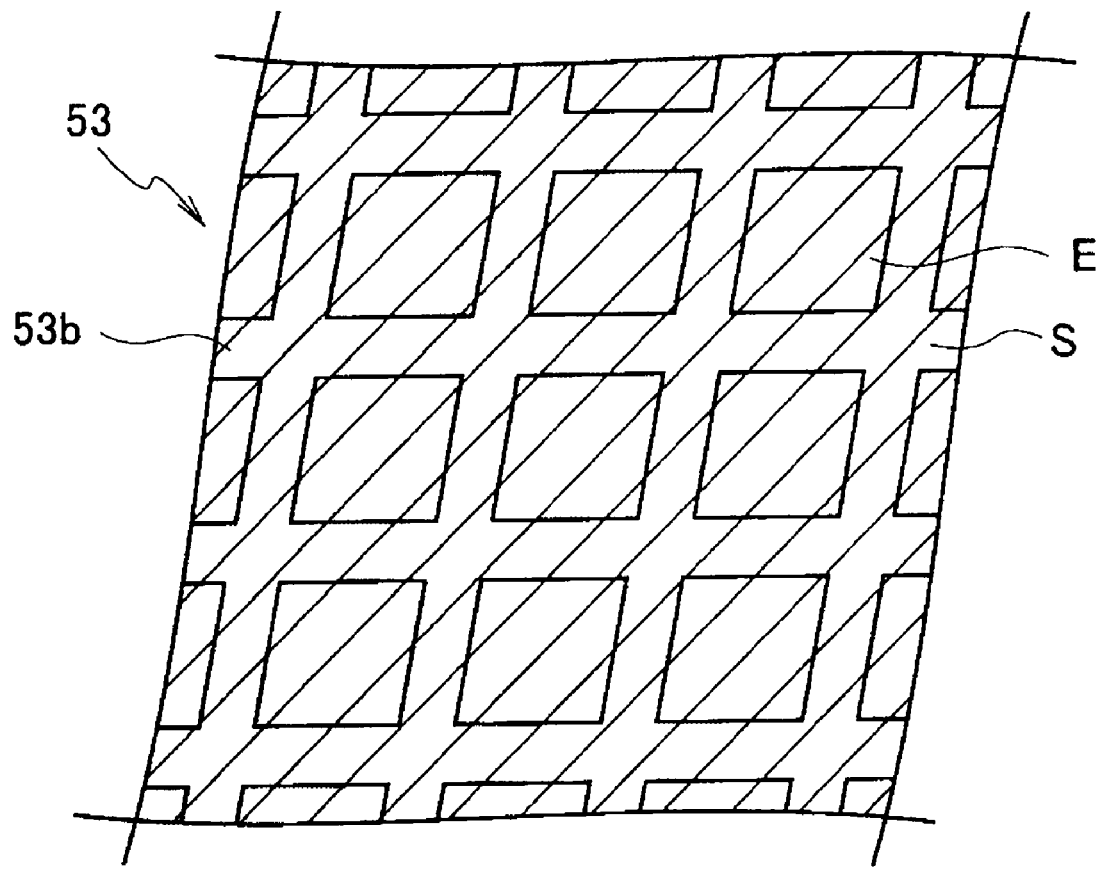
FIG. 30 is a perspective view of the work showing the method for fabricating the semiconductor device according to the sixth embodiment of the present invention.

FIG. 30 is a plane view of the adhesive film 53 partially enlarged. The adhesive film 53 is viewed obliquely upward in FIG. 30. The adhesive layer 53b can be partially viewed, however, the body 53a under the adhesive layer 53b can not be viewed.

Figure 31:
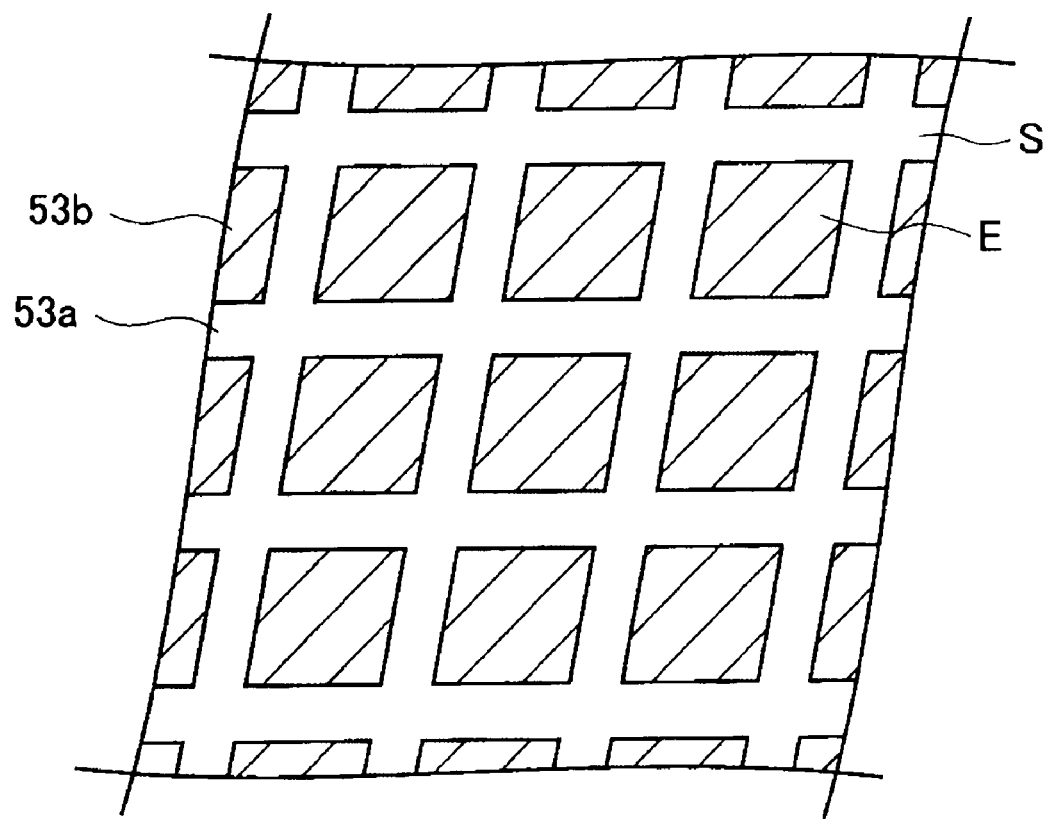
FIG. 31 is a perspective view of the work showing the method for fabricating the semiconductor device according to the sixth embodiment of the present invention.

Only a region of the adhesive layer 53b in the street portion S is peeled off in the state as mentioned above. As shown in FIG. 31, the adhesive layer 53b is leaved in the semiconductor chip disposing portion E, however, the body 53a under the peeled region is exposed in the street portion S.

The adhesive film 53 is inversed and is stuck on the first encapsulating material 3a. The adhesive layer 53b of the semiconductor chip disposing portion E is sandwiched between the first encapsulating material 3a and the body 53a (not illustrated).

Figure 32:
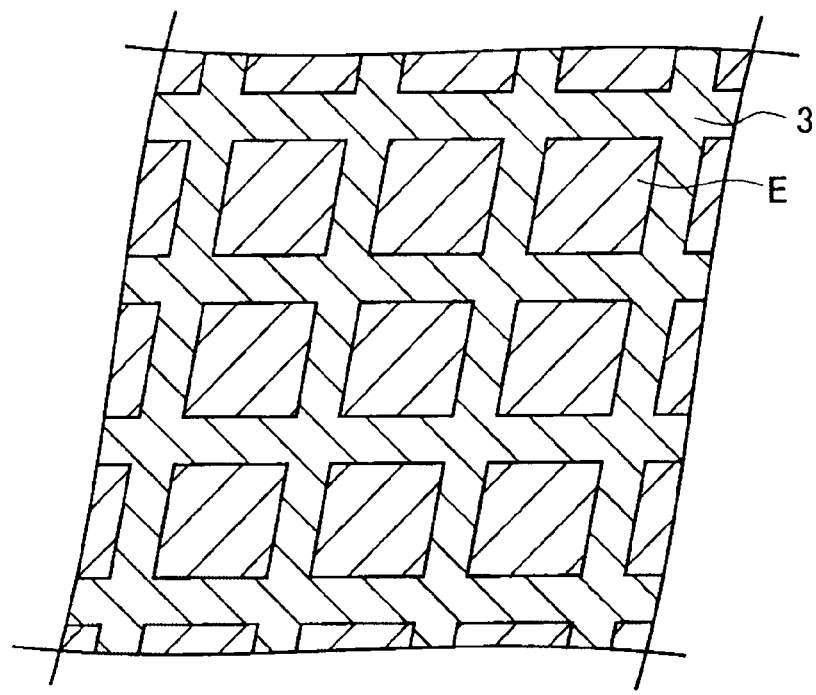
FIG. 32 is a perspective view of the work showing the method for fabricating the semiconductor device according to the sixth embodiment of the present invention.

As shown in FIG. 32, the body 53a is peeled off. The adhesive layer 53b is leaved in the semiconductor chip disposing portion E and the first encapsulating material 3a can be seen in the street portion S. The wafer W as explained using FIG. 29 is inversed so that the semiconductor chip 5 is able to be directly disposed on the semiconductor chip disposing portion E to be bonded by thermocompression. The semiconductor chip must be precisely aligned on the semiconductor chip disposing portion E without misalignment. Furthermore, heating is additionally necessary as characteristics of the DAF in the thermocompression, therefore, heat resistance is necessary for the dicing sheet 51.

Figure 33:
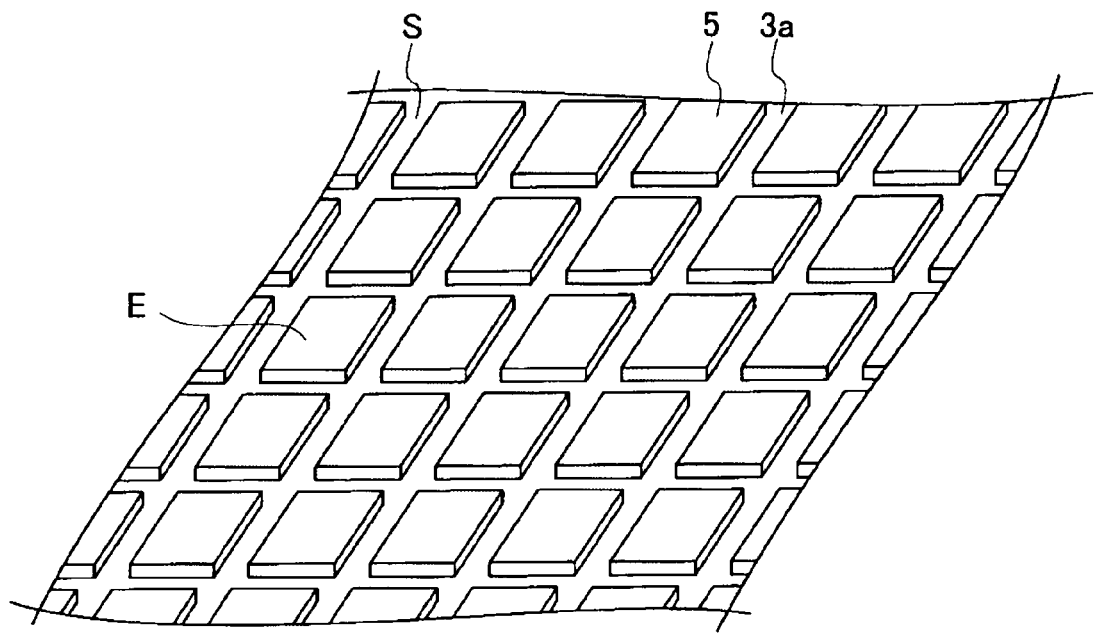
FIG. 33 is a perspective view of the work showing the method for fabricating the semiconductor device according to the sixth embodiment of the present invention.

Subsequently, the dicing sheet 51 tentatively fixed with the wafer W is peeled off. The semiconductor chips 5 in the wafer W inversed is stuck on the semiconductor chip disposing portion E. On the other hand, the adhesive layer 53*b* is already peeled off to the wafer W on the street portion S between the adjacent semiconductor chip s 5 as mentioned above as shown in FIG. 31. The wafer W is stuck on the dicing sheet 51 to be simultaneously removed from the first encapsulating material 3*a* according to the peel of the dicing sheet 51. As a result, only the semiconductor chips 5 are leaved on the first encapsulating material 3*a* as shown in FIG. 33. The semiconductor chips 5 individuated can be aligned on the first encapsulating material 3*a* through the processing steps.

The subsequent processing steps are the same as the processing steps of the semiconductor device in the first embodiment or the semiconductor device in the fourth embodiment, for example. The processing steps include disposing the second encapsulating material 3*b* on the semiconductor chips 5, hardening the encapsulating material 3 by thermocompression to encapsulate the semiconductor chips 5, forming the first hole 3*a*1 in the first encapsulating material 3*a* and the second hole 3*b*1 in the second encapsulating material 3*b* to expose the first electrode 5*a*1 and the second electrode 5*b*1, respectively formed on the first surface 5*a* and the second surface 5*b* in the semiconductor chips 5, performing the first plating which the first conductive material 2*a* and the second conductive material 2*b* is formed to fill the first hole 3*a*1 and the second hole 3*b*1 and to cover the first encapsulating material 3*a* and the second encapsulating material 3*b*, cutting between the adjacent semiconductor chips 5 to individuate into the semiconductor chips 5 and performing the second plating which forms the outer plating film 4 in the first conductive material 2*a* and the second conductive material 2*b* to complete semiconductor device.

Furthermore, the sixth embodiment can be solved on the warpage of the work mutually generated from the first embodiment to the fourth embodiment. Therefore, the processing steps after FIG. 33 can be applicable to the processing steps and the structure from the first embodiment to the fourth embodiment mentioned above.

The takt time in the processing steps can be decreased accompanying with decreasing the chipping which is a problem in individuate the wafer into the semiconductor chips according to the method mentioned above. Accordingly, electrical characteristics of the semiconductor device are improved and reliability of the semiconductor device is retained. Further, the method for fabricating the semiconductor device obtains shortening of the production time to improve productivity.

Furthermore, as the semiconductor device according to the sixth embodiment of the present invention uses the electrode with the five surfaces, the semiconductor device also includes superior effects in the mounting processes. Other than the effects mentioned above, for example, the method can provide to visually confirm a solder connection state when the semiconductor device is configured on the substrate. For another example, the solder between the outer electrode and the substrate can be fully formed for a fillet to be decreased breakage failures by external force such as bombardment.

Seventh Embodiment

Next, a semiconductor device according to a seventh embodiment of the present invention will be described below in detail with reference to FIGS. 34-38.

It is to be noted that the same or similar reference numerals are applied to the same or similar parts and elements throughout the drawings, and the description of the same or similar parts and elements will be omitted or simplified.

The semiconductor device according to the seventh embodiment has the same structure as the semiconductor device according to the first embodiment. Furthermore, a method for fabricating the semiconductor device according to the seventh embodiment is the same as the method for fabricating the semiconductor device according to the first embodiment in providing a process without mount equipment. However, a feature of the seventh embodiment is partially modified as compared to the semiconductor device fabricated by the method according to the first embodiment. In the seventh embodiment as the same as the sixth embodiment, the method for fabricating the semiconductor device is alternatively proposed for being prevented from the chipping in individuate into the semiconductor chips instead of the fabricating process of the semiconductor device in the first embodiment. The fabricating process include sticking the encapsulating material on the one surface of the wafer W and subsequently cutting the wafer W to individuate into the semiconductor chips as explained using FIGS. 3 and 4.

However, the method for fabricating the semiconductor device according to the seventh embodiment is different from the method for fabricating the semiconductor device according to the sixth embodiment on a point that DDF (Dicing-Die bonding Film) is used instead of DAF.

The method for fabricating the semiconductor device according to the seventh embodiment is explained using FIGS. 34-38 as mentioned below. As various kinds of the DDFs are provided in a market, any DDF can be freely used.

Figure 34:
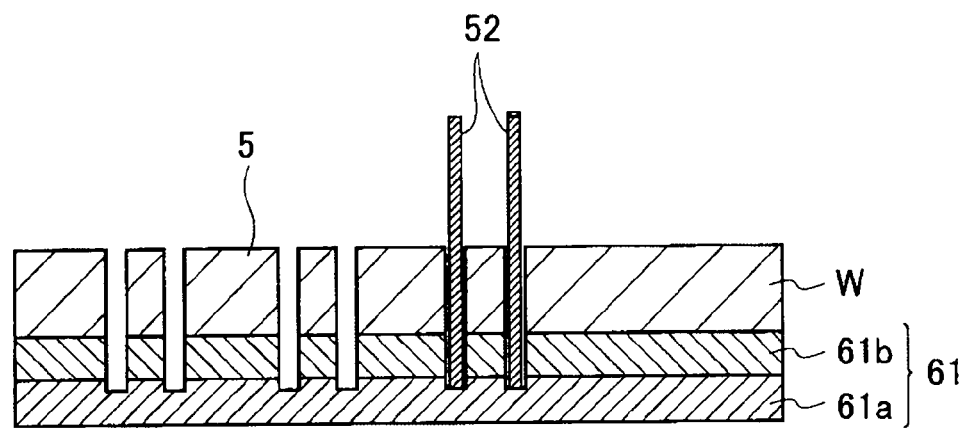
FIG. 34 is a perspective view of a work showing a method for fabricating the semiconductor device according to a seventh embodiment of the present invention.

The wafer W is stuck on an adhesive film 61 constituted with a body 61*a* and an adhesive layer 61*b* as shown in FIG. 34. The adhesive film 61 is a DDF mentioned above and an integrated-type film-like junction agent. The adhesive film 61 has functions combined with a dicing tape and a DAF. In adhesive films 61, the body 61*a* corresponds to the dicing tape.

The wafer W stuck on the DDF is cut to individuate into the semiconductor chips 5. A blade 52 cutting the wafer W is nearly 0.03 mm-0.05 mm wide, for example, and two of the blades 52 are shown in FIG. 34 as an explanation. Feeding speed of the wafer w can be faster by using the blade 52 to cut the wafer w with a higher speed than using the wider blade. As shown in FIG. 34, the blade 52 is configured on the street portion S between the adjacent semiconductor chips 5 to cut to be each semiconductor chip.

Figure 35:
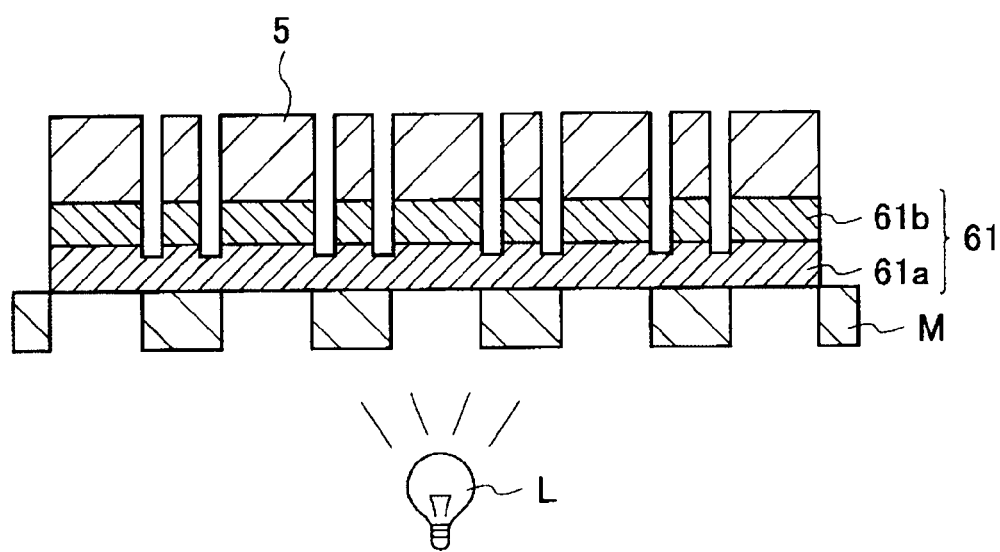
FIG. 35 is a perspective view of the work showing the method for fabricating the semiconductor device according to the seventh embodiment of the present invention.

As shown in FIG. 35, a mask M is aligned on the opposed side of the front surface of the wafer W. The body 61*a* is sandwiched between the mask M and the wafer W. Subsequently, light is emitted from an irradiation tool L to the mask M. A metal mask or a glass mask is suitably used as the mask M. An opening is formed in the mask M. The opening is formed to be the semiconductor chip 5 bonded with the adhesive layer 61*b* as a grid so that the light is emitted to the semiconductor chips 5 individuated. The mask M is interposed on the semiconductor chip 5 so that the opening is aligned via the body 61*a* and subsequently is disposed on the body 61*a*. The light is emitted from an irradiation tool L in the state. In the seventh embodiment, ultra-violet light (UV light) is irradiated. A kind of the emitted light from the irradiation tool L is due to characteristics of DDF.

In the seventh embodiment, the DDF has a characteristic that adhesion strength of the adhesive layer 61*b* is decreased when the UV light is irradiated. Therefore, a region having to be decreased the adhesion strength is emitted with the UV light via the mask M.

Figure 36:
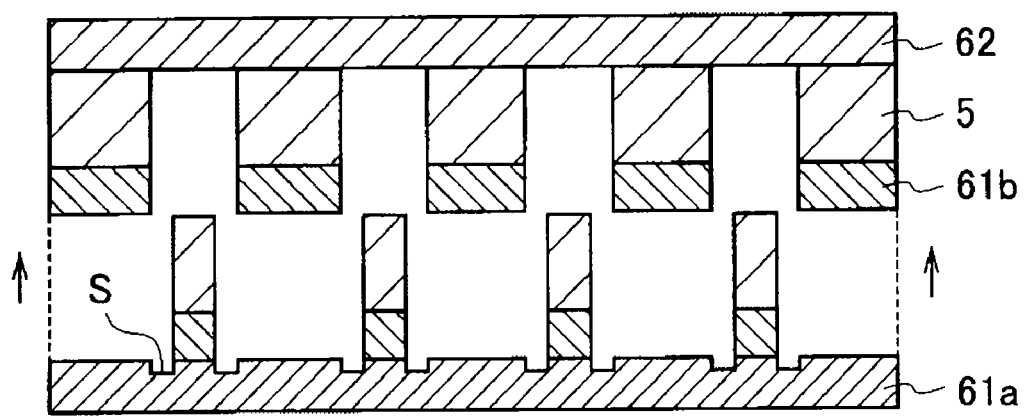
FIG. 36 is a perspective view of the work showing the method for fabricating the semiconductor device according to the seventh embodiment of the present invention.

As shown in FIG. 36, an adhesive sheet 62 is stuck on the wafer W with the semiconductor chips 5 individuated. The adhesive sheet 62 is used to pick up the semiconductor chips 5 to peel form the body 61a. As the adhesion strength of the adhesive layer 61b is decreased with irradiating the UV light, the semiconductor chips 5 irradiated with the UV light is easily peeled with the adhesive layer 61b so that the semiconductor chips 5 are picked up by using the adhesive sheet 62 to separate from the body 61a. On the other hand, an adsorption stage being only vacuum-adsorbed the semiconductor chips 5 can be used.

On the other hand, the street portion S is leaved on the body 61a. The mask M is not formed on the street portion S. As a result, when the light is emitted from the irradiation tool L, the adhesion strength of the adhesive layer 61b is not decreased. Consequently, when the semiconductor chips 5 is peeled via the adhesive sheet 62, the street portion S is leaved on the body 61a. The semiconductor chip 5 and the street portion S are separated from the wafer W after the processing steps. Accordingly, the adhesion strength of the adhesive sheet 62 is desired to be stronger than that of the body 61.

Figure 37:
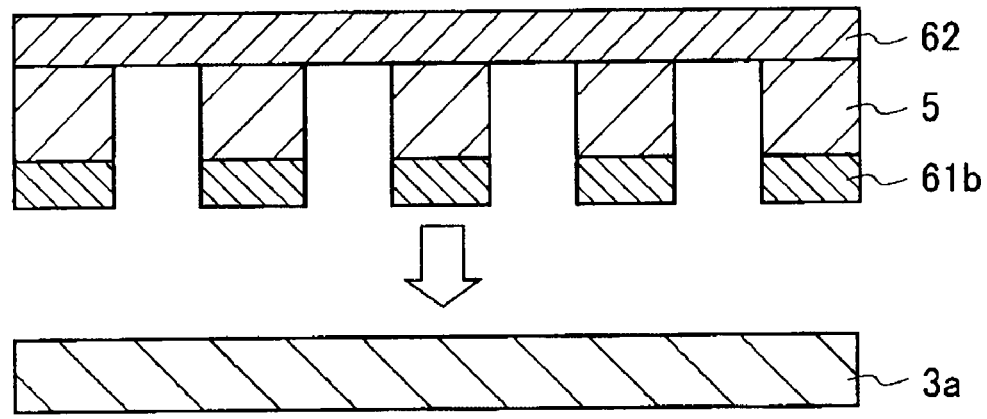
FIG. 37 is a perspective view of the work showing the method for fabricating the semiconductor device according to the seventh embodiment of the present invention.
Figure 38:
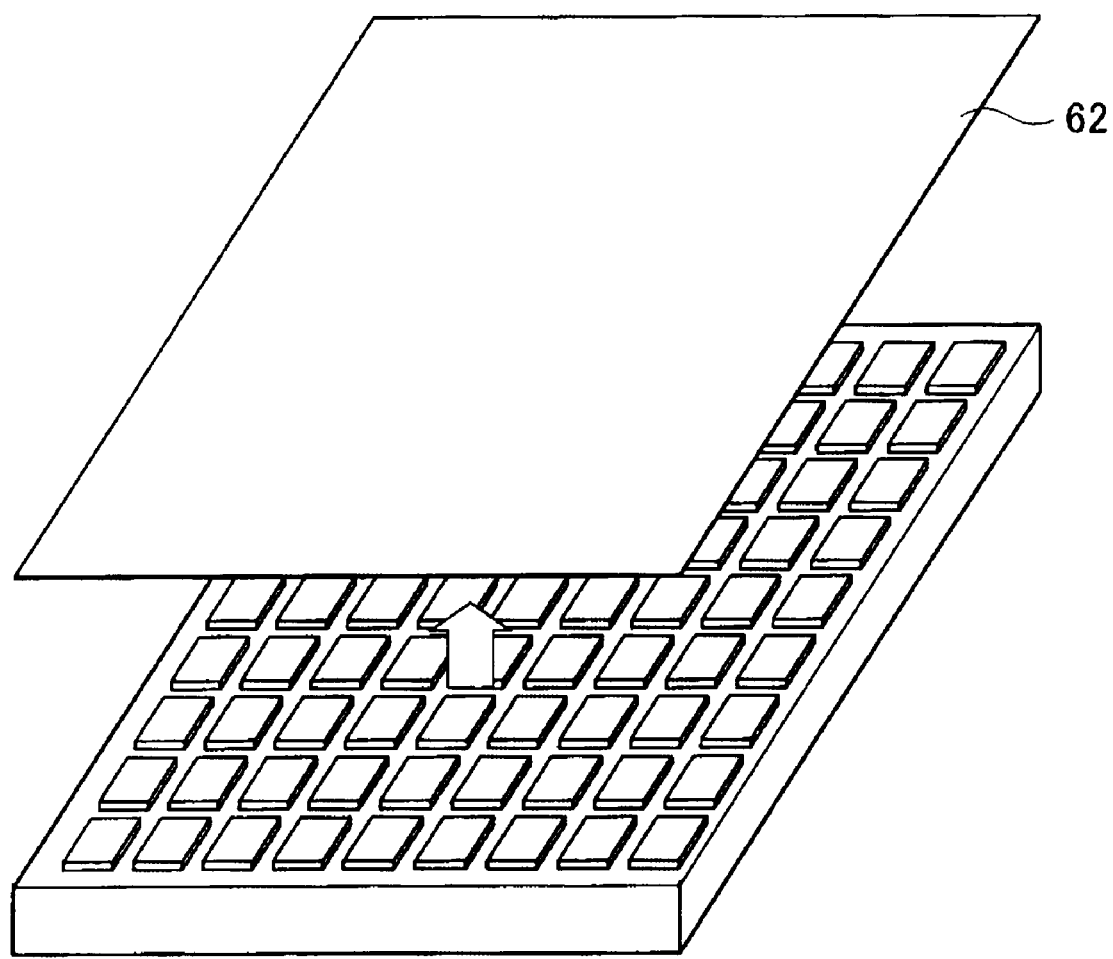
FIG. 38 is a perspective view of the work showing the method for fabricating the semiconductor device according to the seventh embodiment of the present invention.
Figure 39:
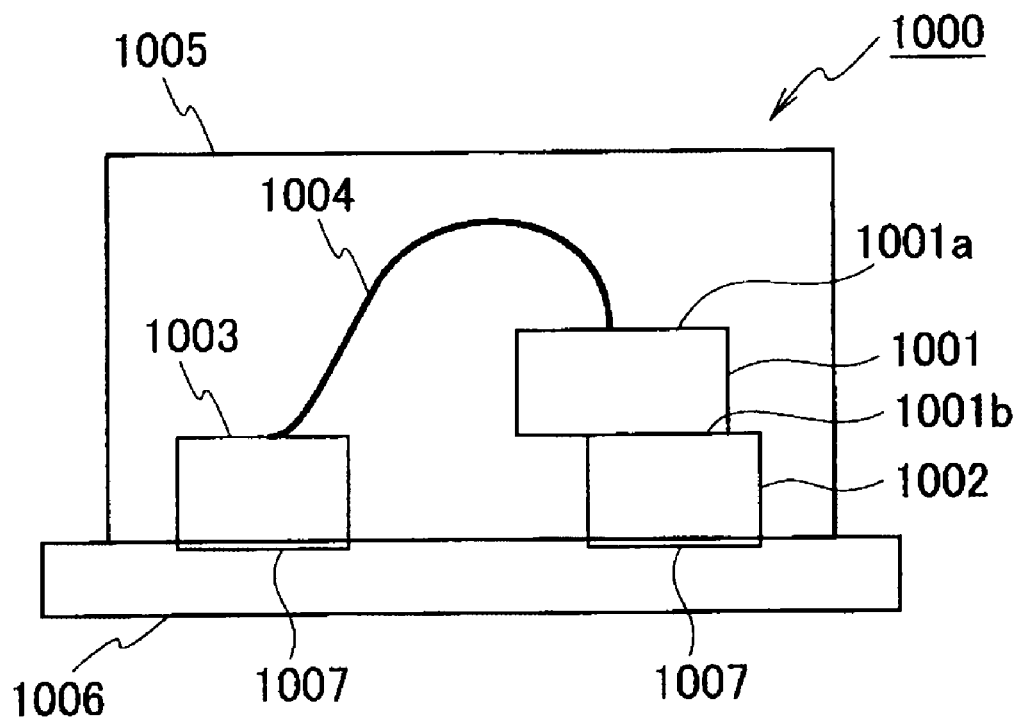
FIG. 39 is a cross-sectional diagram showing a conventional semiconductor device.

As shown in FIG. 37, the semiconductor chips 5 with the adhesive layer 61b is disposed on the first encapsulating material 3a and bonded with the first encapsulating material 3a by thermocompression. The semiconductor chips 5 are connected to first encapsulating material 3a via the adhesive layer 61b. As shown in FIG. 38, the adhesive sheet 62 stuck on the semiconductor chips 5 are subsequently peeled. As a result, the semiconductor chips 5 are disposed on the first encapsulating material 3a as shown in FIG. 38 when the adhesive sheet 62 is peeled. The semiconductor chips 5 individuated on the first encapsulating material 3a are aligned after the processing steps.

The adhesion strength between the semiconductor chip 5 and the first encapsulating material 3a is necessary to be larger than that of the adhesive sheet 62 in the processing steps. Accordingly, when the adhesive sheet with the characteristic can not be used, an adhesive sheet being an UV-peeling type is used and is peeled after the UV irradiation step. On the other hand, an adsorption stage being only vacuum-adsorbed the semiconductor chips 5 can be used.

The subsequent processing steps are the same as the processing steps of the semiconductor device in the first embodiment or the semiconductor device in the fourth embodiment, for example. The processing steps includes being configured the second encapsulating material 3b on the semiconductor chips 5, encapsulating the second encapsulating material 3b by thermocompression, forming the first hole 3a1 in the first encapsulating material 3a and the second hole 3b1 in the second encapsulating material 3b to expose the first electrode 5a1 and the second electrode 5b1 respectively formed on the first surface 5a and the second surface 5b in the semiconductor chips 5, performing the first plating which the first conductive material 2a and the second conductive material 2b are formed to fill the first hole 3a1 and the second hole 3b1 and to cover the first encapsulating material 3a and the second encapsulating material 3b, cutting between the adjacent semiconductor chips 5 to individuate into the semiconductor chips 5 and performing the second plating which forms the outer plating film 4 in the first conductive material 2a and the second conductive material 2b to complete semiconductor device.

Furthermore, the seventh embodiment can be solved on the warpage of the work mutually generated from the first embodiment to the fourth embodiment. Therefore, the processing steps after FIG. 38 can be applicable to the processing steps and the structure from the first embodiment to the fourth embodiment mentioned above.

The takt time in the processing steps can be decreased accompanying with decreasing the chipping which is a problem in individuating the wafer into the semiconductor chips according to the method mentioned above. Accordingly, electrical characteristics of the semiconductor device are improved and reliability of the semiconductor device is retained. Further, the method for fabricating the semiconductor device obtains shortening of the production time to improve productivity.

Furthermore, as the semiconductor device according to the seventh embodiment of the present invention uses the electrode with the five surfaces, the semiconductor device also includes superior effects in the mounting processes. Other than the effects mentioned above, for example, the method can provide to visually confirm a solder connection state when the semiconductor device is configured on the substrate. For another example, the solder between the outer electrode and the substrate can be fully formed for a fillet to be decreased breakage failures by external force such as bombardment.

Furthermore, color of the encapsulating material can be arbitrary changed. When the semiconductor chip 5 is encapsulated, polarity of the semiconductor device can be represented by using the encapsulating material with different colors. A size of the semiconductor device can be easily modified by arbitrarily coordinating thicknesses of the resin substrate or the sheet encapsulating material, a size or a distance of the through-holes formed in each region, or the like.

The structure without using the bonding wire is obtained according to the present invention as mentioned above. Accordingly, electrical characteristics of the semiconductor device are improved and reliability of the semiconductor device is retained. Further, the method for fabricating the semiconductor device obtains shortening of the production time to improve productivity.

Furthermore, other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:
1. A semiconductor device, comprising:
a semiconductor chip including a semiconductor element, a first electrode of the semiconductor element being configured on a first surface of the semiconductor chip, a second electrode of the semiconductor element being configured on a second surface opposed to the first surface of the semiconductor chip;
an encapsulating material encapsulating the semiconductor chip, a first hole and a second hole being configured in the encapsulating material to expose a portion of the first electrode and a portion of the second electrode, respectively;
a first conductive material being connected to the first electrode on the first surface of the semiconductor chip via the first hole;

a second conductive material being connected to the second electrode on the second surface of the semiconductor chip via the second hole; and a plating film covering five surfaces of the first conductive material other than one surface contacting with the encapsulating material and five surfaces of the second conductive material other than one surface contacting with the encapsulating material.

2. The semiconductor memory device according to claim 1, wherein
the encapsulating material is sandwiched between the first conductive material and the second conductive material and is formed to be a convex band, and the plating film is formed on a step portion in the first conductive material and the second conductive material, the step portion contacting with the convex band.

3. The semiconductor device according to claim 2, wherein the plating film is formed on a portion of the first conductive material and a portion of the second conductive material being formed on the same plane as the step portion and the encapsulating material.

4. The semiconductor device according to claim 1, further comprising;
a substrate having a pattern, one of the first conductive material or the second conductive material being configured to be contacted with the pattern; and
a solder being formed on the pattern and surrounding the plating film, the solder being mechanically connected to the pattern and the plating film.

5. The semiconductor device according to claim 4, wherein the solder penetrates into a space between the pattern and the plating film.

6. The semiconductor device according to claim 4, wherein the encapsulating material has a concave portion and the solder penetrates into the concave portion.

7. The semiconductor device according to claim 6, wherein the concave portion has a linear shape or a crossing shape.

8. The semiconductor device according to claim 1, wherein the encapsulating material is melted and hardened by heating to encapsulate the semiconductor chip.

* * * * *